United States Patent
Tagami

(10) Patent No.: US 11,380,638 B2
(45) Date of Patent: Jul. 5, 2022

(54) SEMICONDUCTOR DEVICE INCLUDING BONDING PADS AND METHOD OF MANUFACTURING THE SAME

(71) Applicant: Kioxia Corporation, Minato-ku (JP)

(72) Inventor: Masayoshi Tagami, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 37 days.

(21) Appl. No.: 17/009,234

(22) Filed: Sep. 1, 2020

(65) Prior Publication Data
US 2021/0265293 A1     Aug. 26, 2021

(30) Foreign Application Priority Data

Feb. 25, 2020   (JP) .............................. JP2020-029644

(51) Int. Cl.
*H01L 23/00*     (2006.01)
*H01L 25/00*     (2006.01)
(Continued)

(52) U.S. Cl.
CPC .............. *H01L 24/05* (2013.01); *H01L 24/03* (2013.01); *H01L 24/06* (2013.01); *H01L 24/08* (2013.01);
(Continued)

(58) Field of Classification Search
CPC ......... H01L 24/05; H01L 24/03; H01L 24/06; H01L 24/08; H01L 24/80; H01L 25/18; H01L 25/50; H01L 27/11556; H01L 27/11582; H01L 2224/0346; H01L 2224/03612; H01L 2224/03845; H01L 2224/03848; H01L 2224/05018;
(Continued)

(56) References Cited

U.S. PATENT DOCUMENTS 9,728,521 B2 *   8/2017   Tsai ................... H01L 21/3212
10,685,875 B2 *   6/2020   Hatano ............ H01L 21/76846
(Continued)

FOREIGN PATENT DOCUMENTS

WO   WO 2019/124085 A1   6/2019

OTHER PUBLICATIONS

Takamasa Usui et al., "Highly Reliable Copper Dual-Damascene Interconnects with Self-Formed $MnSi_xO_y$ Barrier Layer" IEEE Transactions on Electron Devices, vol. 53, No. 10, Oct. 2006, 8 pages.

*Primary Examiner* — Mamadou L Diallo
(74) *Attorney, Agent, or Firm* — Oblon, McClelland, Maier & Neustadt, L.L.P.

(57) ABSTRACT

In one embodiment, a semiconductor device includes a substrate, a first interconnection provided above the substrate, and a first pad provided on the first interconnection. The device further includes a second pad provided on the first pad, and a second interconnection provided on the second pad. Furthermore, the first pad includes a first layer provided in a first insulator above the substrate, and a second layer that is provided in the first insulator via the first layer and is in contact with the first interconnection, or the second pad includes a third layer provided in a second insulator above the substrate, and a fourth layer that is provided in the second insulator via the third layer and is in contact with the second interconnection.

20 Claims, 23 Drawing Sheets

(51) Int. Cl.
*H01L 25/18* (2006.01)
*H01L 27/11556* (2017.01)
*H01L 27/11582* (2017.01)

(52) U.S. Cl.
CPC .............. *H01L 24/80* (2013.01); *H01L 25/18* (2013.01); *H01L 25/50* (2013.01); *H01L 27/11556* (2013.01); *H01L 27/11582* (2013.01); *H01L 2224/0346* (2013.01); *H01L 2224/03612* (2013.01); *H01L 2224/03845* (2013.01); *H01L 2224/03848* (2013.01); *H01L 2224/05018* (2013.01); *H01L 2224/05026* (2013.01); *H01L 2224/05073* (2013.01); *H01L 2224/05186* (2013.01); *H01L 2224/05546* (2013.01); *H01L 2224/05561* (2013.01); *H01L 2224/05567* (2013.01); *H01L 2224/05573* (2013.01); *H01L 2224/05647* (2013.01); *H01L 2224/0616* (2013.01); *H01L 2224/06517* (2013.01); *H01L 2224/08145* (2013.01); *H01L 2924/0537* (2013.01); *H01L 2924/0544* (2013.01); *H01L 2924/0549* (2013.01); *H01L 2924/1431* (2013.01); *H01L 2924/14511* (2013.01)

(58) Field of Classification Search
CPC . H01L 2224/05026; H01L 2224/05073; H01L 2224/05186; H01L 2224/05546; H01L 2224/05561; H01L 2224/05567; H01L 2224/05573; H01L 2224/05647; H01L 2224/0616; H01L 2224/06517; H01L 2224/08145; H01L 2924/0537; H01L 2924/0544; H01L 2924/0549; H01L 2924/1431; H01L 2924/14511; H01L 25/105; H01L 2225/06541; H01L 2225/06562; H01L 2225/06568; H01L 2225/1047; H01L 25/0657; H01L 27/11573; H01L 27/11575
See application file for complete search history.

(56) References Cited

U.S. PATENT DOCUMENTS

| | | | | |
|---|---|---|---|---|
| 11,088,076 | B2* | 8/2021 | Okina | .............. H01L 24/05 |
| 2014/0117546 | A1* | 5/2014 | Liu | ............... H01L 23/53295 |
| | | | | 257/751 |
| 2016/0013160 | A1* | 1/2016 | Chun | .............. H01L 24/94 |
| | | | | 257/751 |
| 2017/0358553 | A1* | 12/2017 | Kim | ............... H01L 25/0657 |
| 2019/0279952 | A1* | 9/2019 | Tagami | ................. H01L 25/18 |
| 2020/0035643 | A1 | 1/2020 | Hirata et al. | |
| 2021/0296269 | A1* | 9/2021 | Sharangpani | ..... H01L 23/49503 |
| 2021/0327838 | A1* | 10/2021 | Hou | ................ H01L 24/05 |
| 2021/0366855 | A1* | 11/2021 | Oki | ................ H01L 24/89 |

* cited by examiner

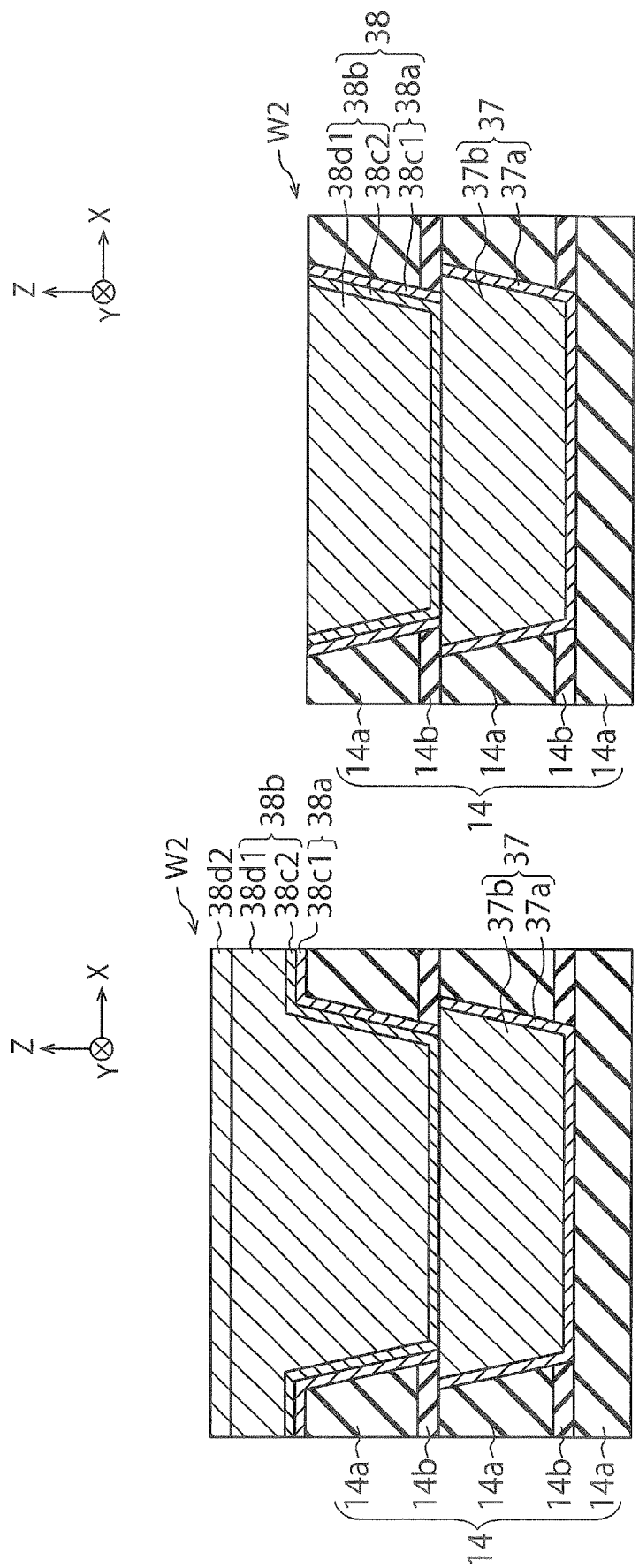

SEMICONDUCTOR DEVICE INCLUDING BONDING PADS AND METHOD OF MANUFACTURING THE SAME

CROSS REFERENCE TO RELATED APPLICATION

This application is based upon and claims the benefit of priority from the prior Japanese Patent Application No. 2020-029644, filed on Feb. 25, 2020, the entire contents of which are incorporated herein by reference.

FIELD

Embodiments described herein relate to a semiconductor device and a method of manufacturing the same.

BACKGROUND

When manufacturing a semiconductor device by bonding metal pads of wafers, it is desired to form the metal pads so as to be suitable for the bonding.

BRIEF DESCRIPTION OF THE DRAWINGS

FIGS. 12A to 13B are cross-sectional views illustrating a second example of the method of manufacturing the semiconductor device of the first embodiment;

DETAILED DESCRIPTION

In one embodiment, a semiconductor device includes a substrate, a first interconnection provided above the substrate, and a first pad provided on the first interconnection. The device further includes a second pad provided on the first pad, and a second interconnection provided on the second pad. Furthermore, the first pad includes a first layer provided in a first insulator above the substrate, and a second layer that is provided in the first insulator via the first layer and is in contact with the first interconnection, or the second pad includes a third layer provided in a second insulator above the substrate, and a fourth layer that is provided in the second insulator via the third layer and is in contact with the second interconnection.

Embodiments will now be explained with reference to the accompanying drawings. In FIGS. 1 to 23B, the same components are denoted by the same reference symbols and duplicate descriptions thereof will be omitted.

First Embodiment

Figure 1:
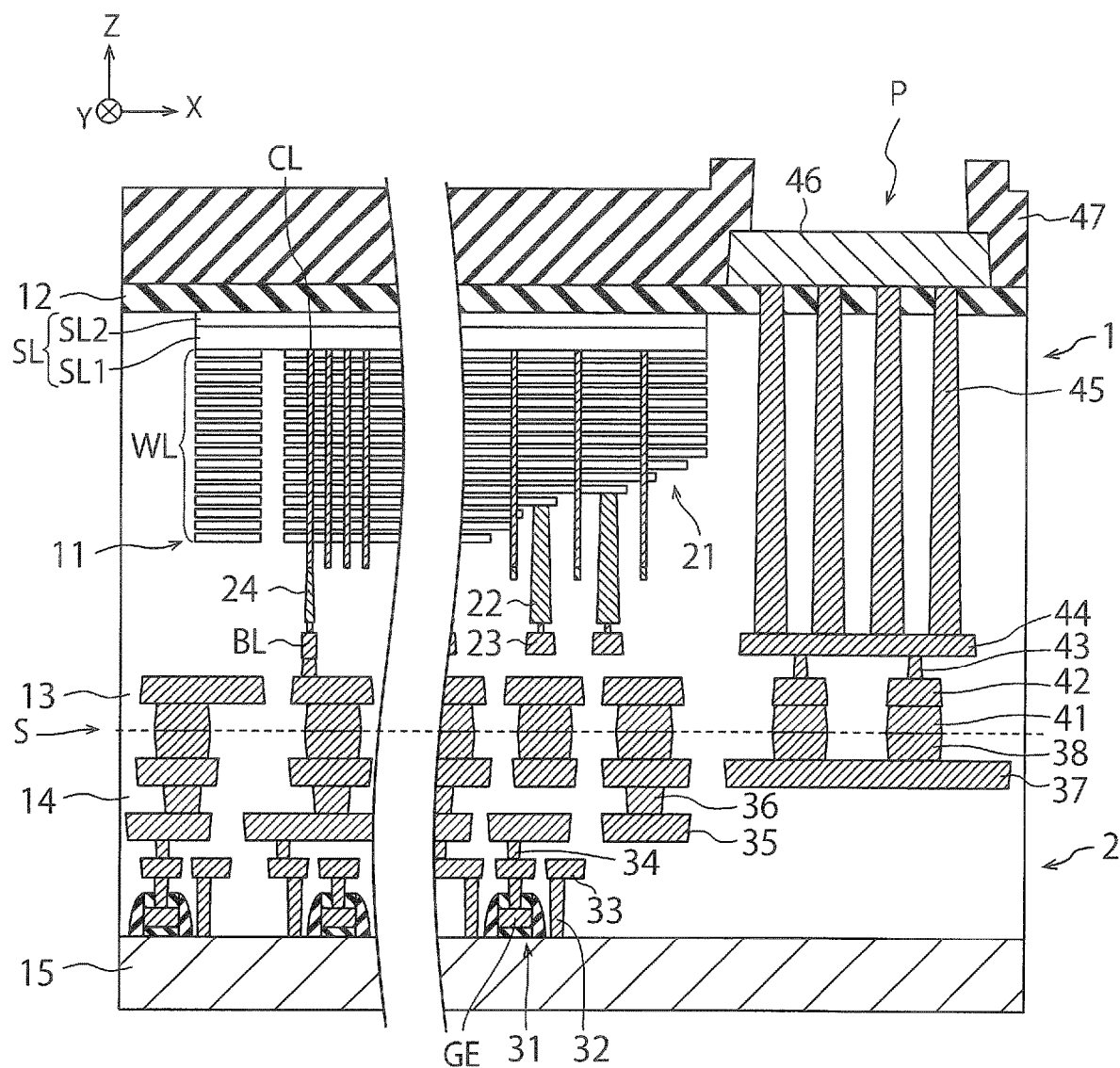
FIG. 1 is a cross-sectional view illustrating the structure of a semiconductor device of a first embodiment.

FIG. 1 is a cross-sectional view illustrating the structure of a semiconductor device of a first embodiment. The semiconductor device illustrated in FIG. 1 is a three-dimensional memory including an array chip 1 and a circuit chip 2 that are bonded together.

The array chip 1 includes a memory cell array 11 including a plurality of memory cells, an insulator 12 on the memory cell array 11, and an inter layer dielectric 13 under the memory cell array 11. The insulator 12 is, for example, a silicon oxide film or a silicon nitride film. The inter layer dielectric 13 is, for example, a silicon oxide film, or a laminated film including a silicon oxide film and another insulator. The inter layer dielectric 13 is an example of a second insulator.

The circuit chip 2 is provided below the array chip 1. The array chip 1 and the circuit chip 2 are bonded at a bonding face, indicated by reference symbol S. The circuit chip 2 includes an inter layer dielectric 14, and a substrate 15 under the inter layer dielectric 14. The inter layer dielectric 14 is, for example, a silicon oxide film, or a laminated film including a silicon oxide film and another insulator. The inter layer dielectric 14 is an example of a first insulator. The substrate 15 is, for example, a semiconductor substrate such as a silicon substrate.

FIG. 1 illustrates X and Y directions that are parallel to a surface of the substrate 15 and are perpendicular to each other, and Z direction that is perpendicular to the surface of the substrate 15. In the present specification, +Z direction is treated as an upward direction, and −Z direction is treated as a downward direction. The −Z direction may or may not match the direction of gravity.

The array chip 1 includes, as electrode layers in the memory cell array 11, a plurality of word lines WL and a source line SL. FIG. 1 illustrates a stairway structure portion 21 of the memory cell array 11. Each word line WL is electrically connected to a word interconnection layer 23 via a contact plug 22. Each columnar portion CL penetrating the plurality of word lines WL is electrically connected to a bit line BL via a via plug 24, and is electrically connected to the source line SL. The source line SL includes a primary layer SL1 that is a semiconductor layer and a secondary layer SL2 that is a metal layer.

The circuit chip 2 includes a plurality of transistors 31. Each transistor 31 includes a gate electrode GE provided on the substrate 15 via a gate insulator, and a source diffusion layer (not illustrated) and a drain diffusion layer (not illustrated) that are provided in the substrate 15. Further, the circuit chip 2 includes a plurality of contact plugs 32 provided on the gate electrodes GE, the source diffusion layers or the drain diffusion layers of these transistors 31, an interconnection layer provided on these contact plugs 32 and including a plurality of interconnections 33, and a plurality of via plugs 34 provided on this interconnection layer.

The circuit chip 2 further includes an interconnection layer provided on these via plugs 34 and including a plurality of interconnections 35, a plurality of via plugs 36 provided on this interconnection layer, an interconnection layer provided on these via plugs 36 and including a plurality of interconnections 37, and a plurality of metal pads 38 provided on the interconnection layer. The metal pad 38 includes, for example, a Cu (copper) layer or an Al (aluminum) layer. The interconnection 37 is an example of a first interconnection, and the metal pad 38 is an example of a first pad. The circuit chip 2 functions as a control circuit (a logic circuit) that controls operations of the array chip 1. The control circuit is configured with the transistors 31 and the like, and is electrically connected to the metal pads 38.

The array chip 1 includes a plurality of metal pads 41 provided on the metal pads 38, an interconnection layer provided on the metal pads 41 and including a plurality of interconnections 42, and a plurality of via plugs 43 provided on this interconnection layer. The metal pad 41 includes, for example, a Cu layer or an Al layer. The metal pad 41 is an example of a second pad, and the interconnection 42 is an example of a second interconnection.

The array chip 1 further includes an interconnection layer provided on these via plugs 43 and including a plurality of interconnections 44, a plurality of via plugs 45 provided on this interconnection layer, a metal pad 46 provided on these via plugs 45 or on the insulator 12, and a passivation film 47 provided on the metal pad 46 or the insulator 12. The metal pad 46 includes, for example, a Cu layer or an Al layer, and functions as an external connection pad (a bonding pad) of the semiconductor device illustrated in FIG. 1. The passivation film 47 is, for example, an insulator such as a silicon oxide film, and has an aperture P that exposes an upper face of the metal pad 46. The metal pad 46 can be connected, through the aperture P, to a mounting substrate or another device by means of a bonding wire, a solder ball, a metal bump, or the like.

Figure 2:
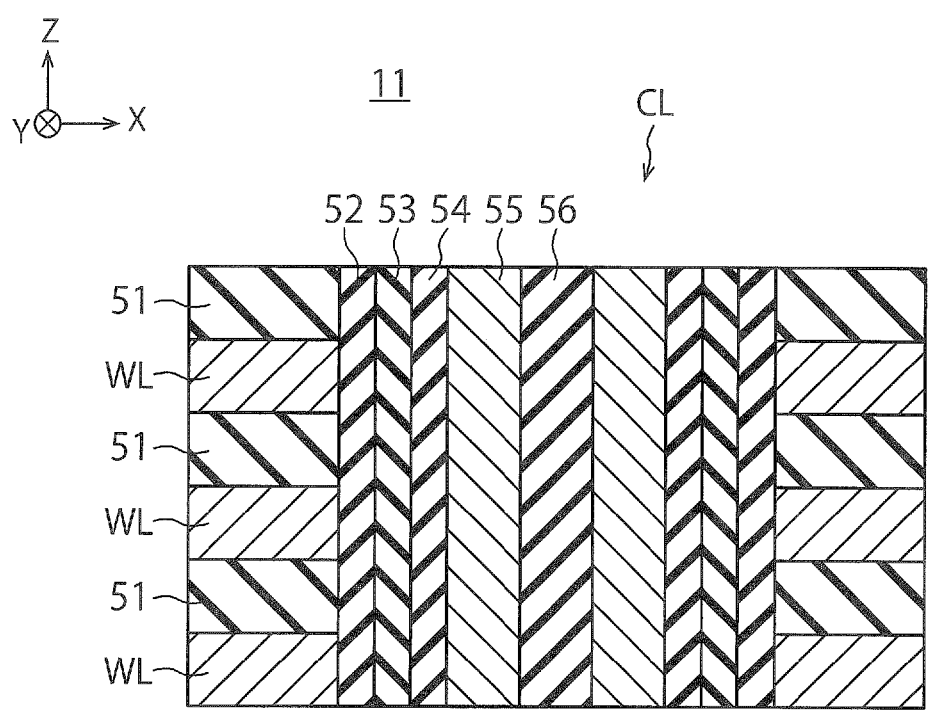
FIG. 2 is a cross-sectional view illustrating the structure of a columnar portion of the first embodiment.

FIG. 2 is a cross-sectional view illustrating the structure of the columnar portion CL of the first embodiment.

As illustrated in FIG. 2, the memory cell array 11 includes the plurality of word lines WL and a plurality of insulating layers 51 that are alternately stacked on the inter layer dielectric 13 (see FIG. 1). The word line WL is, for example, a tungsten (W) layer. The insulating layer 51 is, for example, a silicon oxide film.

The columnar portion CL includes a block insulator 52, a charge storage layer 53, a tunnel insulator 54, a channel semiconductor layer 55, and a core insulator 56 that are sequentially arranged. The charge storage layer 53 is, for example, a silicon nitride film, and is formed, via the block insulator 52, on side faces of the word lines WL and the insulating layers 51. The charge storage layer 53 may be a semiconductor layer such as a polysilicon layer. The channel semiconductor layer 55 is, for example, a polysilicon layer, and is formed, via the tunnel insulator 54, on a side face of the charge storage layer 53. Each of the block insulator 52, the tunnel insulator 54, and the core insulator 56 is, for example, a silicon oxide film or a metal insulator.

Figure 3:
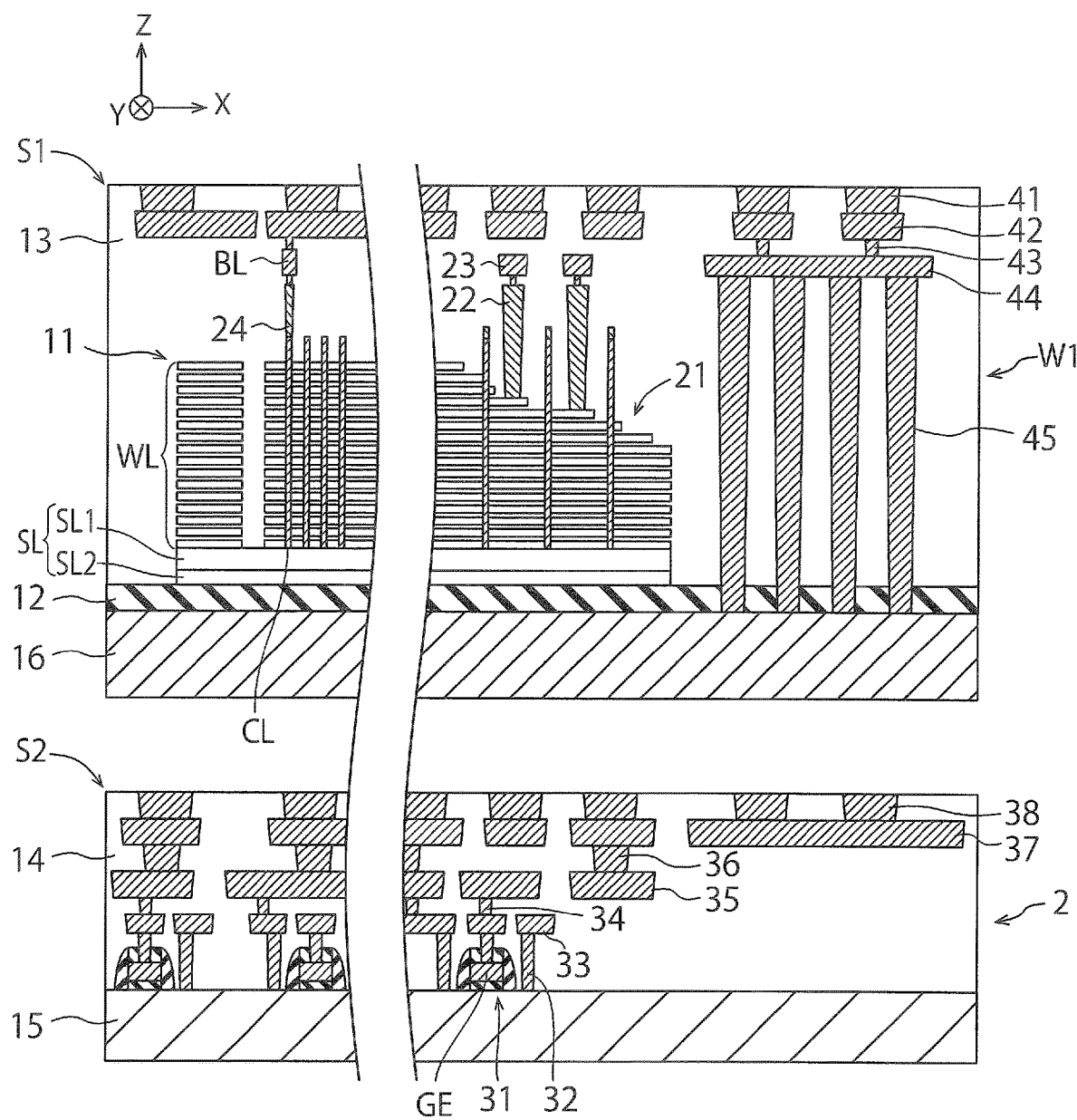
FIG. 3 is a cross-sectional view illustrating a method of manufacturing the semiconductor device of the first embodiment.

FIG. 3 is a cross-sectional view illustrating a method of manufacturing the semiconductor device of the first embodiment. FIG. 3 illustrates an array wafer W1 including a plurality of array chips 1, and a circuit wafer W2 including a plurality of circuit chips 2. The array wafer W1 is also called a memory wafer, and the circuit wafer W2 is also called a CMOS wafer.

Note that the orientation of the array wafer W1 illustrated in FIG. 3 is opposite to the orientation of the array chip 1 illustrated in FIG. 1. In the present embodiment, the array wafer W1 and the circuit wafer W2 are bonded to manufacture a semiconductor device. FIG. 3 illustrates a state of the array wafer W1 before the orientation thereof is turned over for bonding, and FIG. 1 illustrates a state of the array chip 1 after the orientation thereof is turned over for bonding and then bonded and diced.

In FIG. 3, reference symbol 51 indicates an upper face of the array wafer W1, and reference symbol S2 indicates an upper face of the circuit wafer W2. Note that the array wafer W1 includes a substrate 16 provided under the insulator 12. The substrate 16 is, for example, a semiconductor substrate such as a silicon substrate. The substrate 15 is an example of a first substrate, and the substrate 16 is an example of a second substrate.

In the present embodiment, first, as illustrated in FIG. 3, the memory cell array 11, the insulator 12, the inter layer dielectric 13, the stairway structure portion 21, the metal pads 41, and the like are formed on the substrate 16 of the array wafer W1. The inter layer dielectric 14, the transistors 31, the metal pads 38, and the like are formed on the substrate 15 of the circuit wafer W2. For example, the via plugs 45, the interconnections 44, the via plugs 43, the interconnections 42, and the metal pads 41 are sequentially formed on the substrate 16. Further, the contact plugs 32, the interconnections 33, the via plugs 34, the interconnections 35, the via plugs 36, the interconnections 37, and the metal pads 38 are sequentially formed on the substrate 15. Next, the array wafer W1 and the circuit wafer W2 are bonded together under a mechanical pressure. As a result, the inter layer dielectric 13 and the inter layer dielectric 14 are bonded together. Next, the array wafer W1 and the circuit wafer W2 are annealed at 400° C. As a result, the metal pads 41 and the metal pads 38 are joined together.

Subsequently, the substrate 15 is thinned by chemical mechanical polishing (CMP). And, after the substrate 16 is removed by CMP, the array wafer W1 and the circuit wafer W2 are cut into a plurality of chips. In this way, the semiconductor device of FIG. 1 is manufactured. The metal pad 46 and the passivation film 47 are, for example, formed on the insulator 12, after the thinning of the substrate 15 and the removal of the substrate 16.

In the present embodiment, although the array wafer W1 and the circuit wafer W2 are bonded together, it may be feasible to bond the array wafers W1 together instead. The above contents described with reference to FIGS. 1 to 3 and the below contents that will be described with reference to FIGS. 4A to 23B are also applicable to the bonding of the array wafers W1.

Further, although FIG. 1 illustrates a boundary face between the inter layer dielectric 13 and the inter layer dielectric 14 and a boundary face between the metal pad 41 and the metal pad 38, these boundary faces are not observed after the above-described annealing, generally. However, the positions where these boundary faces were present can be estimated by detecting, for example, the inclination of the side face of the metal pad 41 or the side face of the metal pad 38 or the positional deviation between the side face of the metal pad 41 and the metal pad 38.

Figure 4B:
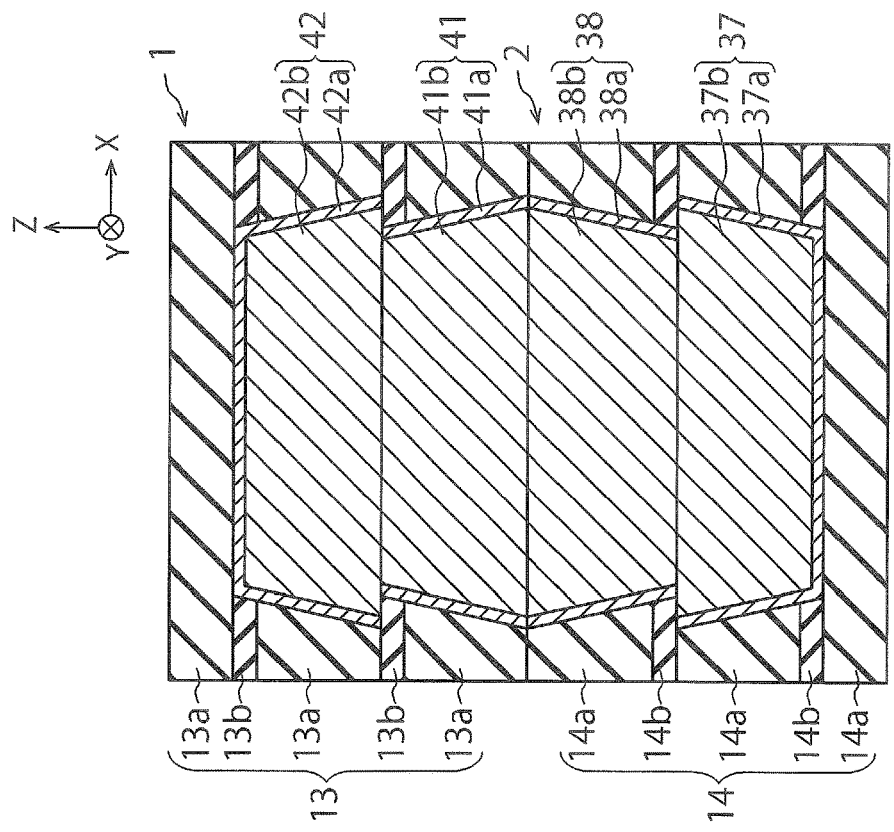
FIGS. 4A and 4B are other cross-sectional views illustrating the structure of the semiconductor device of the first embodiment.
Figure 4A:
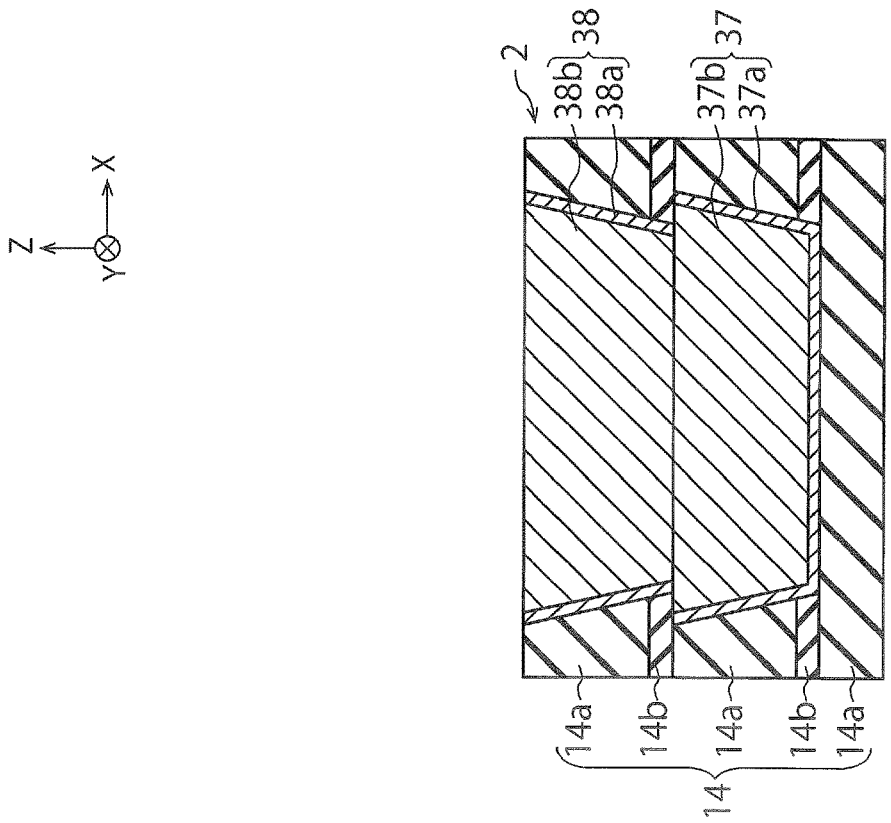

FIGS. 4A and 4B are other cross-sectional views illustrating the structure of the semiconductor device of the first embodiment.

FIG. 4A illustrates the inter layer dielectric 14, one of the plurality of interconnections 37, and one of the plurality of metal pads 38 illustrated in FIG. 1. Hereinafter, the inter layer dielectric 14, the interconnection 37, and the metal pad 38 illustrated in FIG. 4A will be described in detail. The following description is applicable to the remaining interconnections 37 and the remaining metal pads 38 illustrated in FIG. 1.

The inter layer dielectric 14 includes a plurality of insulators 14a and a plurality of insulators 14b that are alternately arranged. The insulator 14a is, for example, a silicon oxide ($SiO_2$) film. The insulator 14b is an insulator different from the insulator 14a and is, for example, a silicon carbonitride (SiCN) film. In the present embodiment, in consideration of the difference in etching rate between the insulator 14a and the insulator 14b, an interconnection trench for the interconnection 37 and an aperture for the metal pad 38 can be formed by etching.

The interconnection 37 includes a barrier metal layer 37a formed on side and upper faces of the inter layer dielectric 14, and an interconnection material layer 37b formed, via the barrier metal layer 37a, on the side and upper faces of the inter layer dielectric 14. The barrier metal layer 37a is, for example, a titanium (Ti) film, a titanium nitride (TiN) film, a tantalum (Ta) film, or a tantalum nitride (TaN) film. The interconnection material layer 37b is, for example, a Cu layer. The barrier metal layer 37a is an example of a fifth layer, and the interconnection material layer 37b is an example of a sixth layer. The thickness of the interconnection 37 is, for example, 500 nm. The interconnection 37 of the present embodiment may extend linearly or curvedly in the XY plane.

The metal pad 38 includes a barrier metal layer 38a formed on side faces of the inter layer dielectric 14, and a pad material layer 38b formed, via the barrier metal layer 38a, on the side faces of the inter layer dielectric 14 and directly formed on an upper face of the interconnection 37 (the interconnection material layer 37b). In the present embodiment, since the barrier metal layer 38a does not cover the upper face of the interconnection 37, the pad material layer 38b is in contact with the upper face of the interconnection 37. The barrier metal layer 38a is, for example, a Ti film, a TiN film, a Ta film, or a TaN film. The pad material layer 38b is, for example, a Cu layer. The barrier metal layer 38a is an example of a first layer, and the pad material layer 38b is an example of a second layer. The thickness of the metal pad 38 is, for example, 500 nm. The plane shape of the metal pad 38 is, for example, a square or a rectangle.

The interconnection material layer 37b and the pad material layer 38b may be metal layers including the same metal element other than Cu element. Both of the interconnection material layer 37b and the pad material layer 38b may be, for example, Al layers or may be W layers.

In addition to the inter layer dielectric 14, the interconnection 37, and the metal pad 38 illustrated in FIG. 4A, FIG. 4B illustrates the inter layer dielectric 13, one of the plurality of metal pads 41, and one of the plurality of interconnections 42 that are illustrated in FIG. 1. Hereinafter, the inter layer dielectric 13, the metal pad 41, and the interconnection 42 illustrated in FIG. 4B will be described in detail. The following description is applicable to the remaining metal pads 41 and the remaining interconnections 42 illustrated in FIG. 1.

The inter layer dielectric 13 includes a plurality of insulators 13a and a plurality of insulators 13b that are alternately arranged. The insulator 13a is, for example, an $SiO_2$ film. The insulator 13b is an insulator different from the insulator 13a and is, for example, an SiCN film. In the present embodiment, in consideration of the difference in etching rate between the insulator 13a and the insulator 13b, an aperture for the metal pad 41 and an interconnection trench for the interconnection 42 can be formed by etching.

The interconnection 42 includes a barrier metal layer 42a formed on side and lower faces of the inter layer dielectric 13, and an interconnection material layer 42b formed, via the barrier metal layer 42a, on the side and lower faces of the inter layer dielectric 13. The barrier metal layer 42a is, for example, a Ti film, a TiN film, a Ta film, or a TaN film. The interconnection material layer 42b is, for example, a Cu layer. The barrier metal layer 42a is an example of a seventh layer, and the interconnection material layer 42b is an example of an eighth layer. The thickness of the interconnection 42 is, for example, 500 nm. The interconnection 42 of the present embodiment may extend linearly or curvedly in the XY plane.

The metal pad 41 includes a barrier metal layer 41a formed on side faces of the inter layer dielectric 13, and a pad material layer 41b formed, via the barrier metal layer 41a, on the side faces of the inter layer dielectric 13 and directly formed on a lower face the interconnection 42 (the interconnection material layer 42b). In the present embodiment, since the barrier metal layer 41a does not cover the lower face of the interconnection 42, the pad material layer 41b is in contact with the lower face of the interconnection 42. The barrier metal layer 41a is, for example, a Ti film, a TiN film, a Ta film, or a TaN film. The pad material layer 41b is, for example, a Cu layer. The barrier metal layer 41a is an example of a third layer, and the pad material layer 41b is an example of a fourth layer. The thickness of the metal pad 41 is, for example, 500 nm. The plane shape of the metal pad 41 is, for example, a square or a rectangle. The metal pad 41 is formed on the metal pad 38, and the pad material layer 41b is formed on the pad material layer 38b.

The interconnection material layer 42b and the pad material layer 41b may be metal layers including the same metal element other than Cu element. Both the interconnection material layer 42b and the pad material layer 41b may be, for example, Al layers or may be W layers.

Hereinafter, the metal pads 38 and 41 of the present embodiment will be further described in detail with reference to FIG. 4B.

The metal pad 38 is, for example, formed by forming an aperture in the inter layer dielectric 14, filling the aperture with the material of the metal pad 38, and flattening the surface of this material by CMP. In this case, a recess that is referred to as dishing may be formed on the upper face of the metal pad 38, and accordingly it may become difficult to join the metal pad 38 and the metal pad 41. Therefore, it is desirable to increase the thickness of the metal pad 38, so as to increase the amount of thermal expansion in the pad material layer 38b of the metal pad 38. This makes it possible to reduce the dishing on the upper face of the metal pad 38 by the thermal expansion of the pad material layer 38b, and accordingly the metal pad 38 can be normally joined with the metal pad 41.

However, increasing the thickness of the metal pad 38 requires forming a deep aperture in the inter layer dielectric 14, and accordingly makes it difficult to perform reactive ion etching (RIE) for forming the aperture. Further, this requires thickening the material of the metal pad 38 and increasing the amount of CMP polishing, and accordingly makes it difficult to form the metal pad 38. As a result, problems such as increase in chip thickness of the circuit chip 2, increase in manufacturing cost of the semiconductor device, and unevenness in shape of the metal pad 38 may occur.

Therefore, in the present embodiment, the barrier metal layer 38a of the metal pad 38 is not formed on the upper face of the interconnection 37 so that the pad material layer 38b of the metal pad 38 is directly formed on the upper face of the interconnection material layer 37b of the interconnection 37. According to the present embodiment, it becomes possible to reduce the dishing on the upper face of the metal pad 38 by the thermal expansion of the pad material layer 38b of the metal pad 38 and the thermal expansion of the interconnection material layer 37b of the interconnection 37. In other words, according to the present embodiment, it becomes possible to cause the metal pad 38 and the interconnection 37 to function as an effective metal pad regarding the thermal expansion. The thickness of the metal pad 38 is 500 nm. On the other hand, the effective metal pad thickness is 1 μm. According to the present embodiment, the pad material layer 38b of the metal pad 38 and the interconnection material layer 37b of the interconnection 37 can be integrated, and this makes it possible to obtain effects similar to those of a thick metal pad even when the metal pad 38 is thin. Specifically, it becomes possible with the thin pad material layer 38b (Cu layer) to obtain the amount of thermal expansion similar to a thick pad material layer (Cu layer).

Further, according to the present embodiment, it becomes possible to suppress the problem occurring when the metal pad 38 is thickened. For example, it becomes unnecessary to form a deep aperture in the inter layer dielectric 14, and the RIE for forming the aperture becomes easy. Further, for example, it becomes unnecessary to thicken the material of the metal pad 38 or increase the amount of CMP polishing, and accordingly the formation of the metal pad 38 becomes easy. Furthermore, since the interconnection layer including the interconnections 37 may be used as a normal interconnection layer, it is possible to suppress the increase in chip thickness of the circuit chip 2 when arranging the interconnections 37. The interconnection layer including the interconnection 37 is, for example, used for a power supply interconnection.

The above also holds true for the metal pad 41. In the present embodiment, the barrier metal layer 41a of the metal pad 41 is not formed on the lower face of the interconnection 42 so that the pad material layer 41b of the metal pad 41 is directly formed on the lower face of the interconnection material layer 42b of the interconnection 42. According to the present embodiment, it becomes possible to reduce the dishing on the lower face of the metal pad 41 by the thermal expansion of the pad material layer 41b of the metal pad 41 and the thermal expansion of the interconnection material layer 42b of the interconnection 42.

As mentioned above, according to the present embodiment, it becomes possible to form the metal pads 38 and 41 suitable for bonding.

Figure 5A:
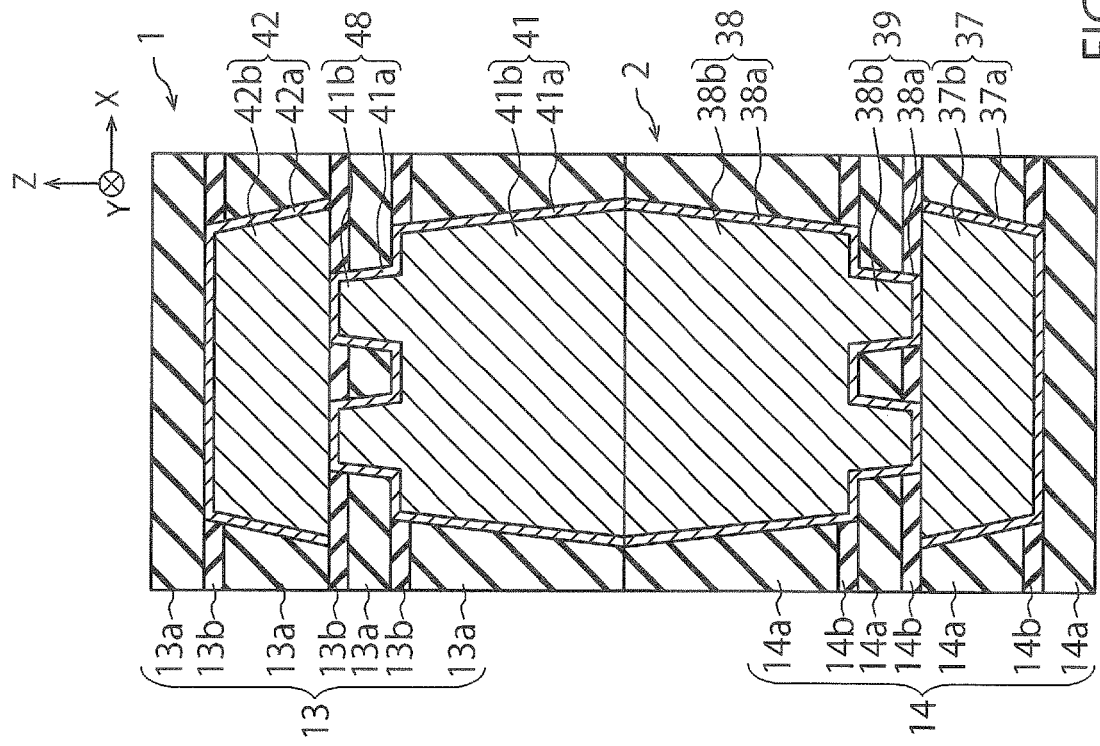
FIGS. 5A and 5B are cross-sectional views illustrating the structure of a semiconductor device of a comparative example of the first embodiment.
Figure 5B:
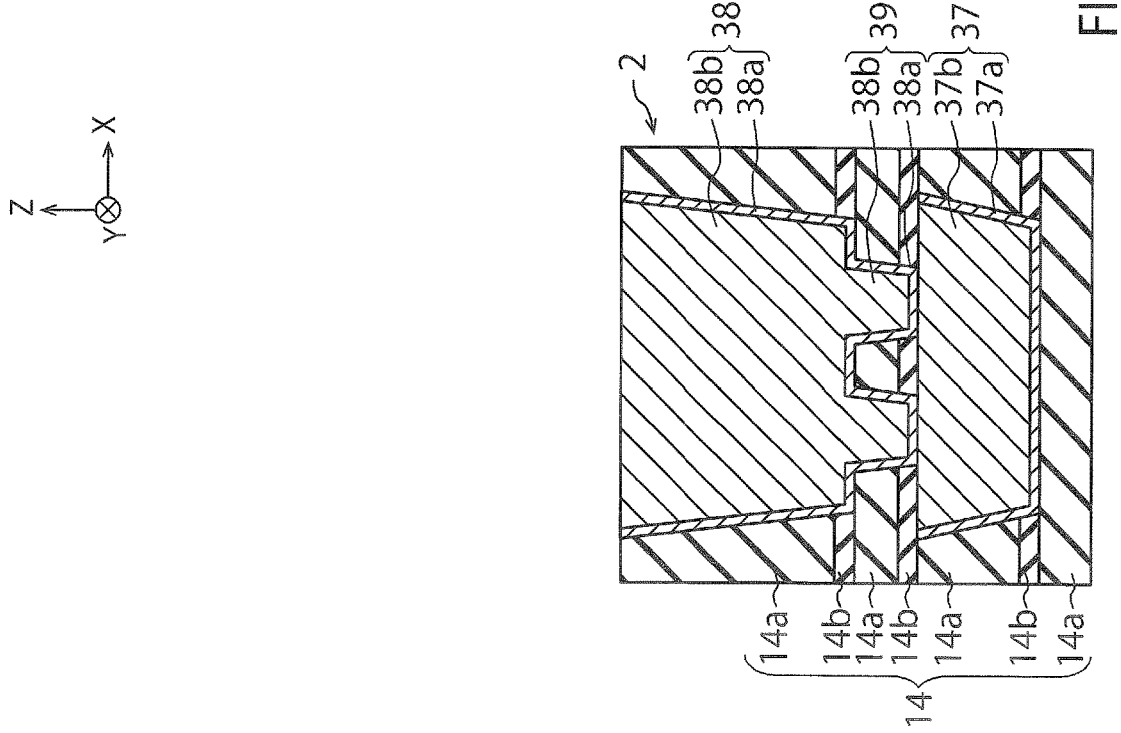

FIGS. 5A and 5B are cross-sectional views illustrating the structure of a semiconductor device of a comparative example of the first embodiment.

FIG. 5A illustrates the inter layer dielectric 14, the interconnection 37, the metal pad 38, which are similar to those illustrated in FIG. 4A, and a plurality of via plugs 39. Hereinafter, an arbitrary one of these via plugs 39 will be described in detail.

The via plug 39 is formed between the interconnection 37 and the metal pad 38. The via plug 39 includes a barrier metal layer 38a and a pad material layer (a plug material layer) 38b that are the same as those of the metal pad 38. The via plug 39 and the metal pad 38 can be formed by the dual damascene method. The pad material layer 38b of the comparative example is formed on the interconnection 37 via the barrier metal layer 38a.

FIG. 5B illustrates the inter layer dielectric 14, the interconnection 37, the metal pad 38, and the plurality of via plugs 39 illustrated in FIG. 5A and the inter layer dielectric 13, the metal pad 41, and the interconnection 42 illustrated in FIG. 4B, and a plurality of via plugs 48. Hereinafter, an arbitrary one of these via plugs 48 will be described in detail.

The via plug 48 is formed between the metal pad 41 and the interconnection 42. The via plug 48 includes a barrier metal layer 41a and a pad material layer (a plug material layer) 41b that are the same as those of the metal pad 41. The via plug 48 and the metal pad 41 can be formed by the dual damascene method. The pad material layer 41b of the comparative example is formed under the interconnection 42 via the barrier metal layer 41a.

Hereinafter, the metal pads 38 and 41 of the comparative example will be described in detail with reference to FIG. 5B.

In this comparative example, the barrier metal layer 38a is formed between the pad material layer 38b of the metal pad 38 and the via plug 39 and the interconnection material layer 37b of the interconnection 37. Therefore, the dishing on the upper face of the metal pad 38 is reduced by the thermal expansion of the pad material layer 38b, but is not reduced by the thermal expansion of the interconnection material layer 37b. Accordingly, in this comparative example, it is necessary to increase the thickness of the metal pad 38. The thicknesses of the metal pad 38, the via plug 39, and the interconnection 37 of the comparative example are, for example, 1 μm, 200 nm, and 500 nm. The above also holds true for the metal pad 41 of the comparative example.

On the other hand, in the present embodiment, the barrier metal layer 38a is not formed between the pad material layer 38b of the metal pad 38 and the interconnection material layer 37b of the interconnection 37. Therefore, according to the present embodiment, the dishing on the upper face of the metal pad 38 can be reduced not only by the thermal expansion of the pad material layer 38b but also by the thermal expansion of the interconnection material layer 37b. According to the present embodiment, such an effect can be obtained by the thin metal pad 38 and the like. Note that the total thickness of the metal pad 38, the via plug 39, and the interconnection 37 of the comparative example is 1.7 μm, while the total thickness of the metal pad 38 and the interconnection 37 of the present embodiment is 1 μm.

The above description also holds true in a case where the metal pad 38 and the via plug 39 of the comparative example are formed by the single damascene method or in a case where the metal pad 41 and the via plug 48 of the comparative example are formed by the single damascene method.

FIGS. 6A to 9B are cross-sectional views illustrating a method of manufacturing the semiconductor device of the first embodiment. Respective processes illustrated in these drawings are performed when manufacturing the semiconductor device illustrated in FIG. 4A or FIG. 4B, and are performed for the circuit wafer W2 in the process illustrated in FIG. 3.

Figure 6B:
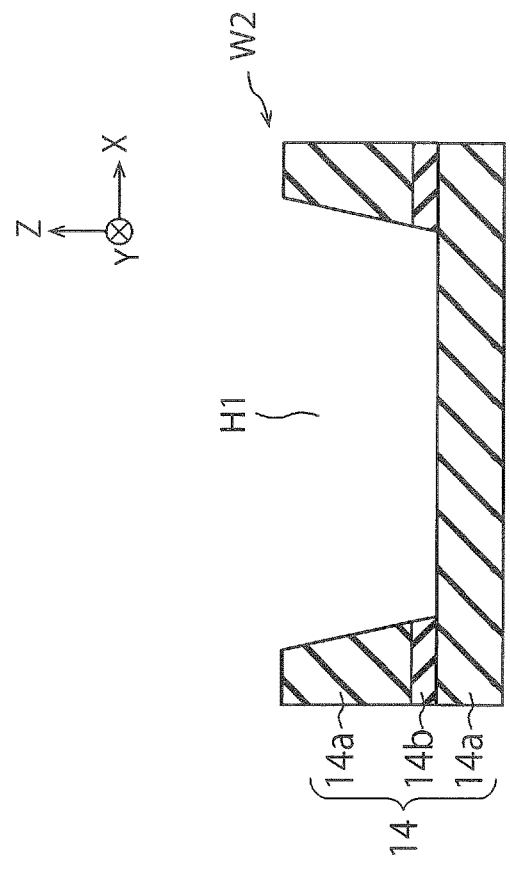
FIGS. 6A to 9B are cross-sectional views illustrating a method of manufacturing the semiconductor device of the first embodiment.
Figure 6A:
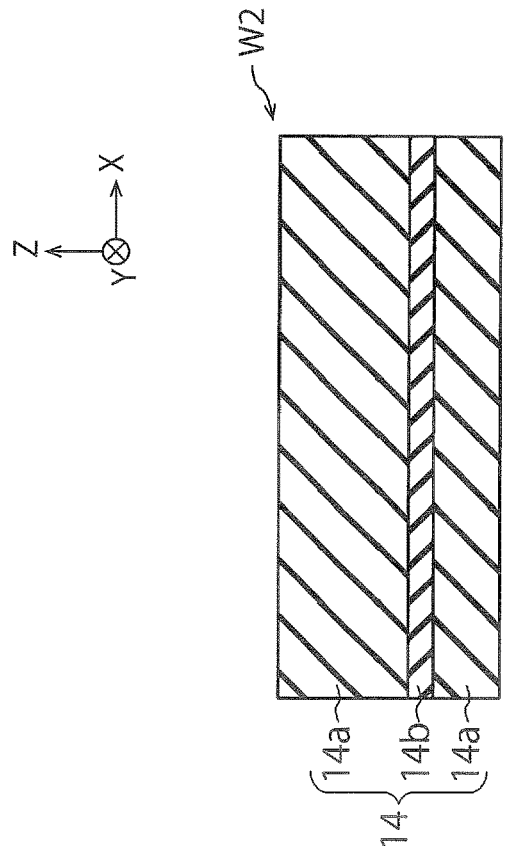
Figure 7B:
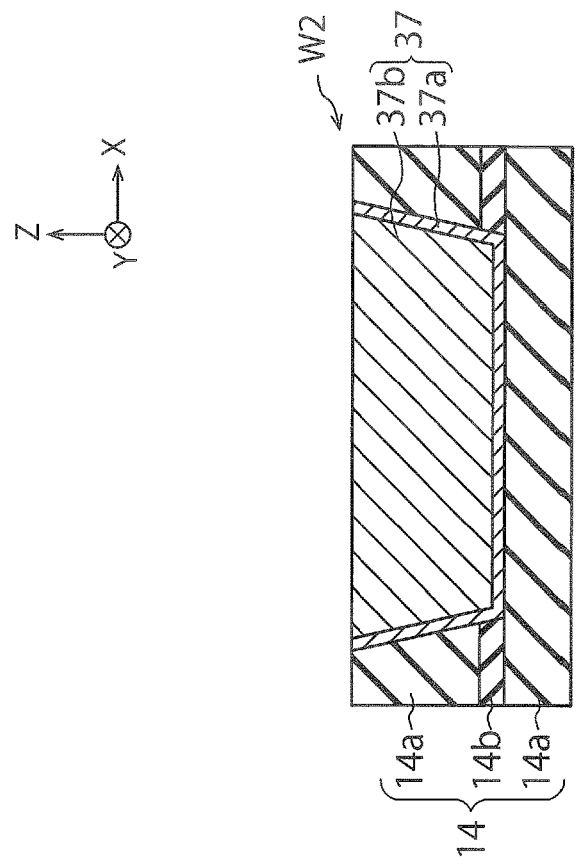
Figure 7A:
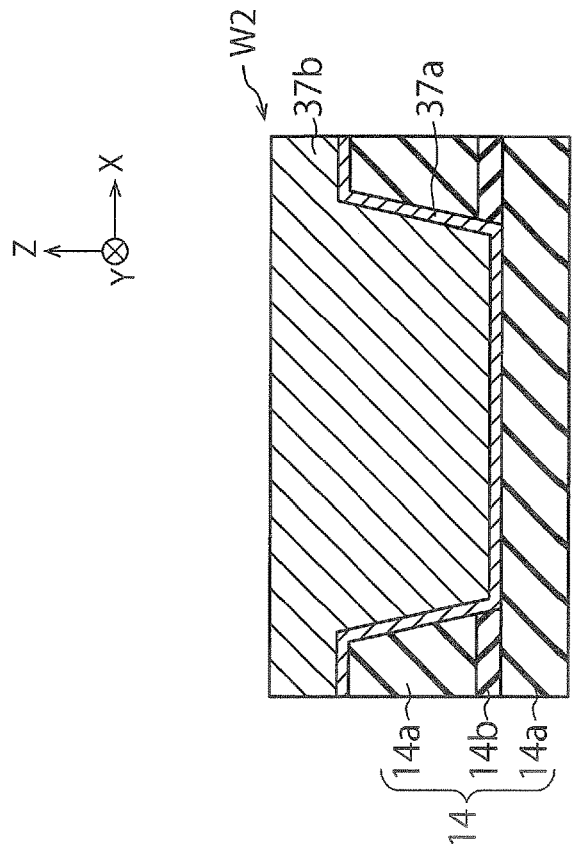

First, above the substrate 15 (not illustrated), the insulator 14a, the insulator 14b, and the insulator 14a are sequentially formed (see FIG. 6A). Next, an interconnection trench H1 is formed by RIE in the latter insulator 14a and the insulator 14b (see FIG. 6B). Next, on the entire surface of the substrate 15, the barrier metal layer 37a and the interconnection material layer 37b are sequentially formed (see FIG. 7A). As a result, the barrier metal layer 37a is formed on side and bottom faces of the interconnection trench H1, and the interconnection material layer 37b is formed, via the barrier metal layer 37a, on the side and bottom faces of the interconnection trench H1. Next, the surfaces of the interconnection material layer 37b and the barrier metal layer 37a are flattened by CMP (see FIG. 7B). As a result, the barrier metal layer 37a and the interconnection material layer 37b outside the interconnection trench H1 are removed, and the interconnection 37 including the barrier metal layer 37a and the interconnection material layer 37b is formed in the interconnection trench H1.

Figure 8A:
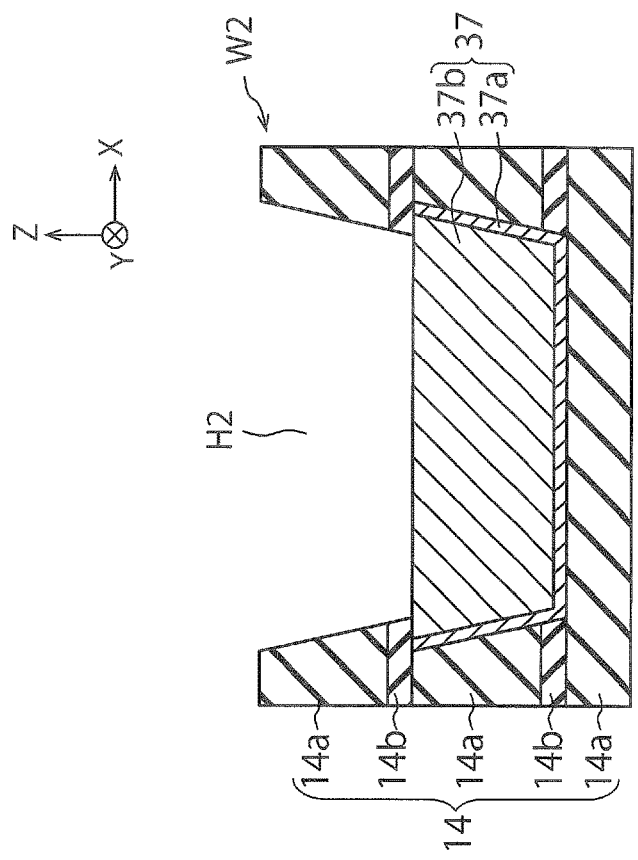
Figure 8B:
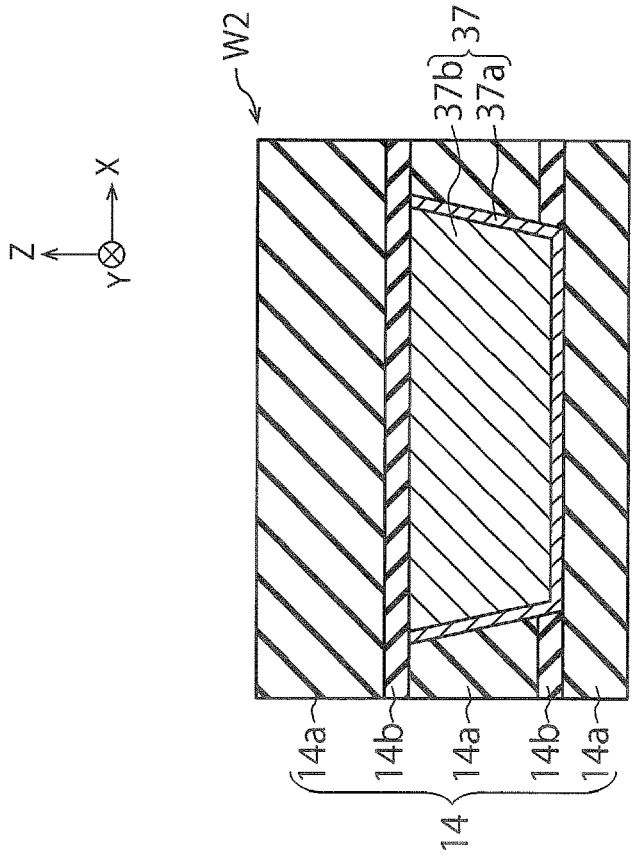
Figure 9A:
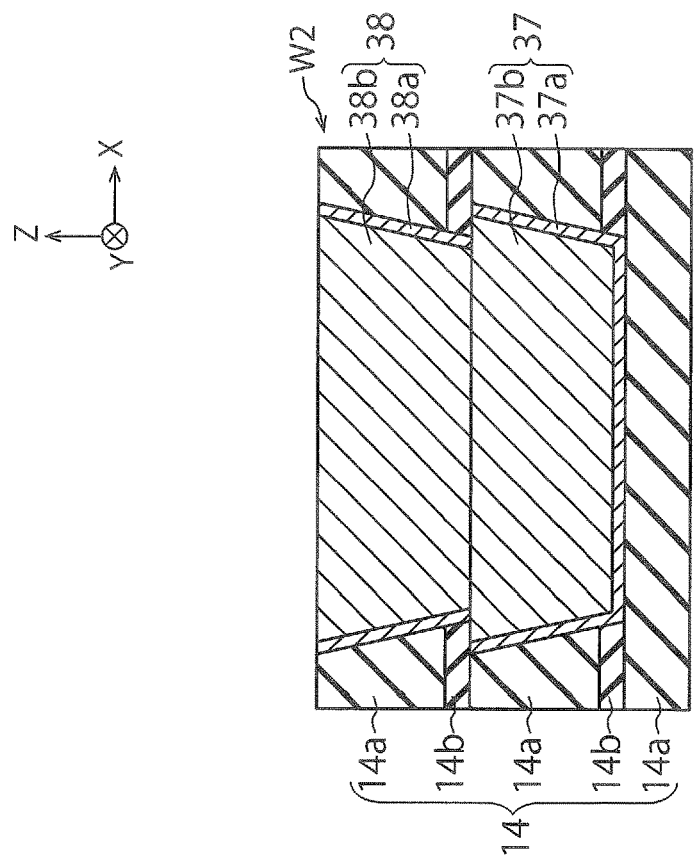
Figure 9B:
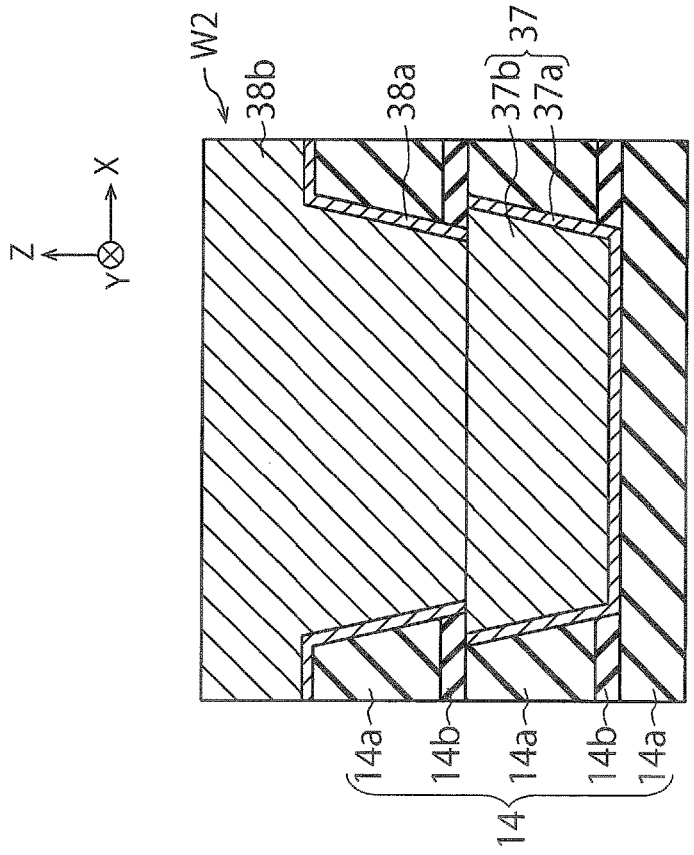

Next, above the substrate 15, the insulator 14b and the insulator 14a are sequentially formed (see FIG. 8A). Next, an aperture H2 is formed by RIE in the insulator 14a and the insulator 14b (see FIG. 8B). As a result, the upper face of the interconnection 37 is exposed in the aperture H2. Next, on the entire surface of the substrate 15, the barrier metal layer 38a and the pad material layer 38b are sequentially formed (see FIG. 9A). As a result, the barrier metal layer 38a is formed on side faces of the aperture H2. Further, the pad material layer 38b is formed on the side faces of the aperture H2 via the barrier metal layer 38a, and is directly formed on the interconnection 37 (the interconnection material layer 37b) on the bottom face of the aperture H2. An example of a method of forming the barrier metal layer 38a and the pad material layer 38b will be described below. Next, the surfaces of the pad material layer 38b and the barrier metal layer 38a are flattened by CMP (see FIG. 9B). As a result, the barrier metal layer 38a and the pad material layer 38b outside the aperture H2 are removed, and the metal pad 38 including the barrier metal layer 38a and the pad material layer 38b is formed in the aperture H2.

The processes illustrated in these drawings are similarly performed for the array wafer W1 in the process illustrated in FIG. 3. Specifically, the processes in these drawings are performed by replacing the substrate 15, the inter layer dielectric 14, the interconnection 37, and the metal pad 38 with the substrate 16, the inter layer dielectric 13, the interconnection 42, and the metal pad 41, respectively. Subsequently, the array wafer W1 and the circuit wafer W2 are bonded together in the process illustrated in FIG. 3 to manufacture the semiconductor device of the present embodiment.

FIGS. 10A to 11B are cross-sectional views illustrating a first example of the method of manufacturing the semiconductor device of the first embodiment. The processes illustrated in these drawings illustrate an example of the process illustrated in FIG. 9A.

Figure 10A:
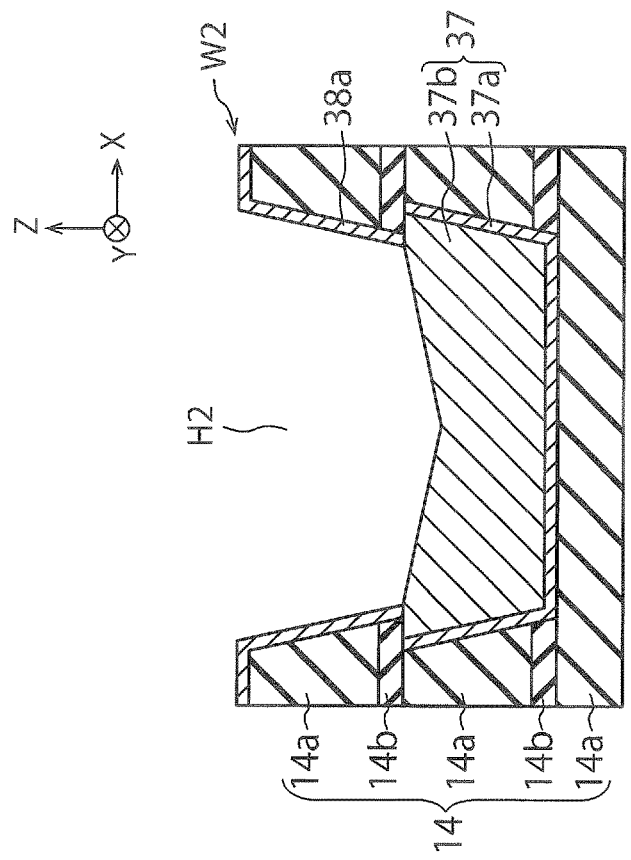
FIGS. 10A to 11B are cross-sectional views illustrating a first example of the method of manufacturing the semiconductor device of the first embodiment.

First, the barrier metal layer 38a is deposited on the entire surface of the substrate 15 (see FIG. 10A). As a result, the barrier metal layer 38a is formed on the upper face of the interconnection 37 in the aperture H2, the side faces of the inter layer dielectric 14 in the aperture H2, and an upper face of the inter layer dielectric 14 outside the aperture H2. At this time, due to the characteristics of the process for depositing the barrier metal layer 38a, the barrier metal layer 38a on the interconnection 37 in the aperture H2 becomes thinner than the barrier metal layer 38a on the inter layer dielectric 14 outside the aperture H2.

Figure 10B:
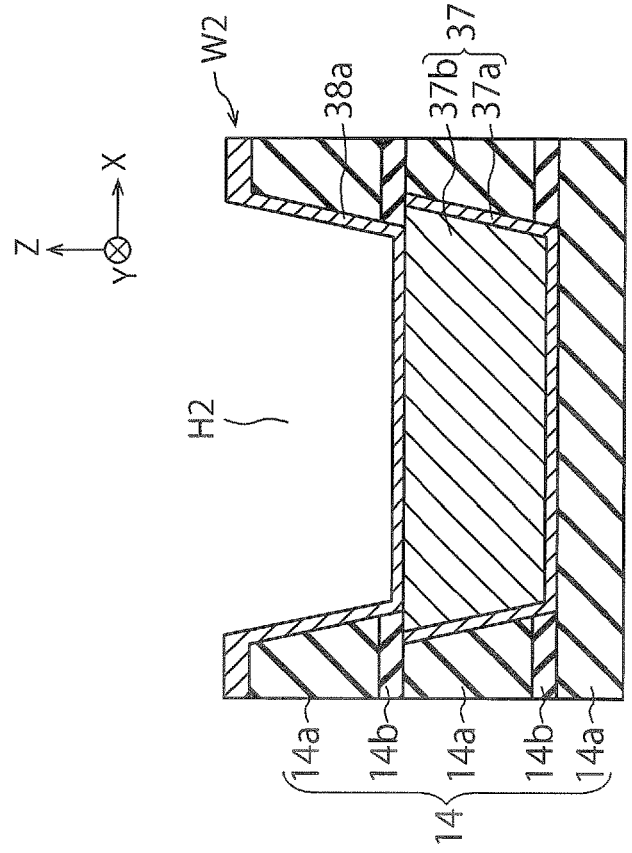

Next, the barrier metal layer 38a is thinned by re-sputtering using argon (Ar) (see FIG. 10B). This makes it possible to remove the barrier metal layer 38a on the interconnection 37 in the aperture H2. As a result, the upper face of the interconnection 37 is exposed again in the aperture H2. The barrier metal layer 38a on the inter layer dielectric 14 outside the aperture H2 is thicker than the barrier metal layer 38a on the interconnection 37 in the aperture H2, and is therefore not completely removed during the above thinning. Further, due to the characteristics of the re-sputtering, the barrier metal layer 38a also remains on the side faces of the inter layer dielectric 14 in the aperture H2.

In the process illustrated in FIG. 10B, there is a possibility that a part of the interconnection material layer 37b is also removed and a recess is formed on the upper face of the interconnection material layer 37b. FIG. 10B illustrates an example of such a recess. When the barrier metal layer 38a on the bottom face of the aperture H2 is removed, atoms generated by the removal of the barrier metal layer 38a may adhere to the barrier metal layer 38a on the side faces of the aperture H2. In this case, the thickness of the barrier metal layer 38a on the side faces of the aperture H2 increases due to the adhesion of such atoms.

Figure 11A:
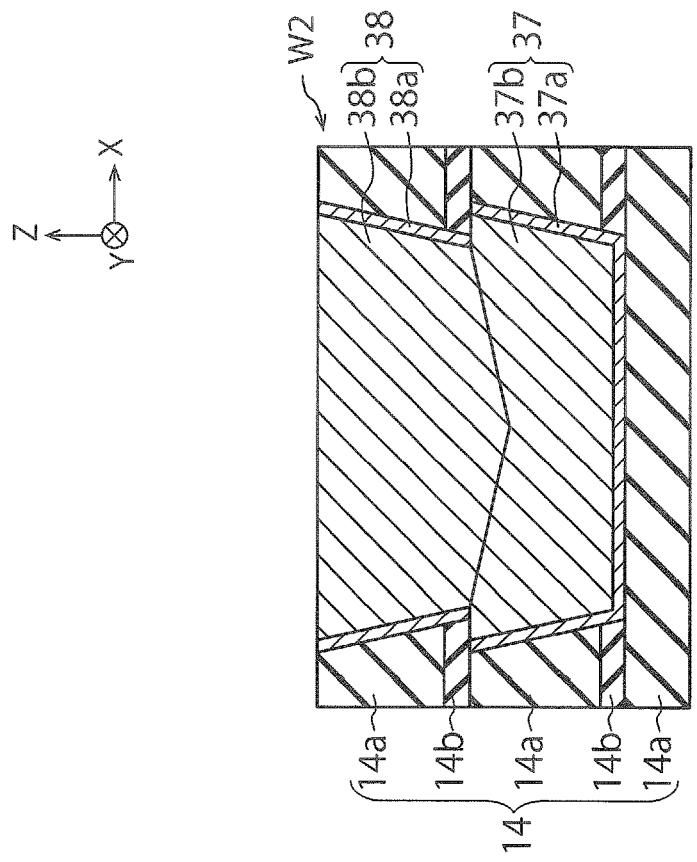

Next, the pad material layer 38b is formed on the entire surface of the substrate 15 (see FIG. 11A). As a result, the pad material layer 38b is formed on the side faces of the aperture H2 via the barrier metal layer 38a, and is directly formed on the interconnection 37 (the interconnection material layer 37b) on the bottom face of the aperture H2.

Figure 11B:
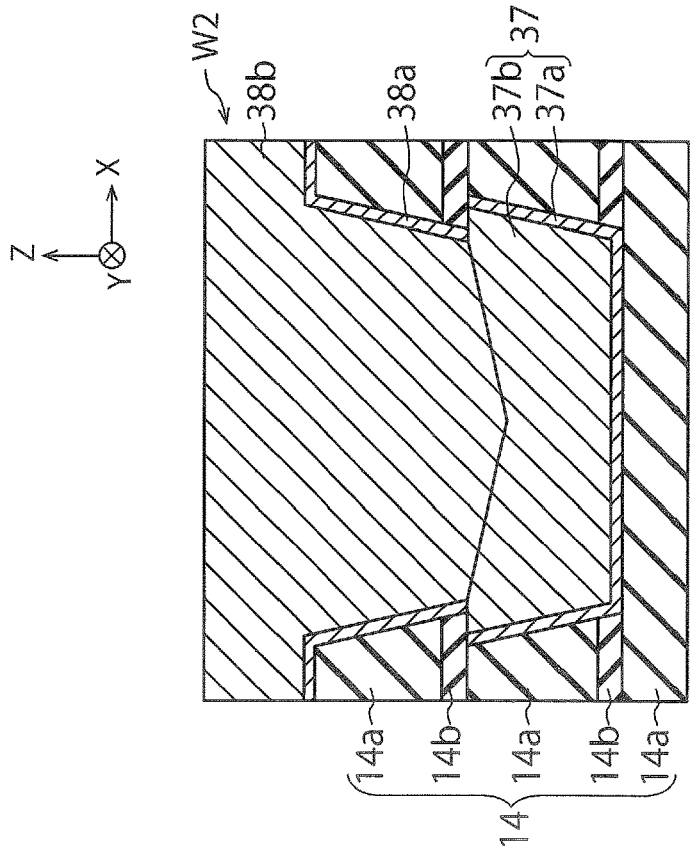

Next, the surfaces of the pad material layer 38b and the barrier metal layer 38a are flattened by CMP (see FIG. 11B). As a result, the barrier metal layer 38a and the pad material layer 38b outside the aperture H2 are removed, and the metal pad 38 including the barrier metal layer 38a and the pad material layer 38b is formed in the aperture H2.

FIGS. 12A to 13B are cross-sectional views illustrating a second example of the method of manufacturing the semiconductor device of the first embodiment. The processes illustrated in these drawings illustrate another example of the process illustrated in FIG. 9A.

Figure 12A:
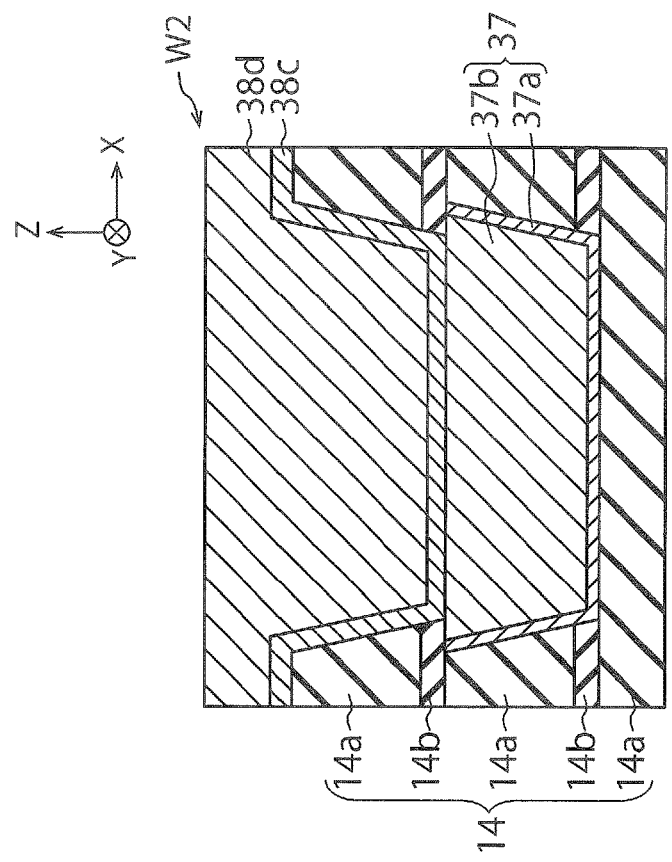

First, on the entire surface of the substrate 15, a metal layer 38c is deposited by sputtering (see FIG. 12A). As a result, the metal layer 38c is formed on the upper face of the interconnection 37 in the aperture H2, the side faces of the inter layer dielectric 14 in the aperture H2, and the upper face of the inter layer dielectric 14 outside the aperture H2. The metal layer 38c is, for example, a CuMn seed layer (Mn stands for manganese). The metal layer 38c is an example of a first film.

Figure 12B:
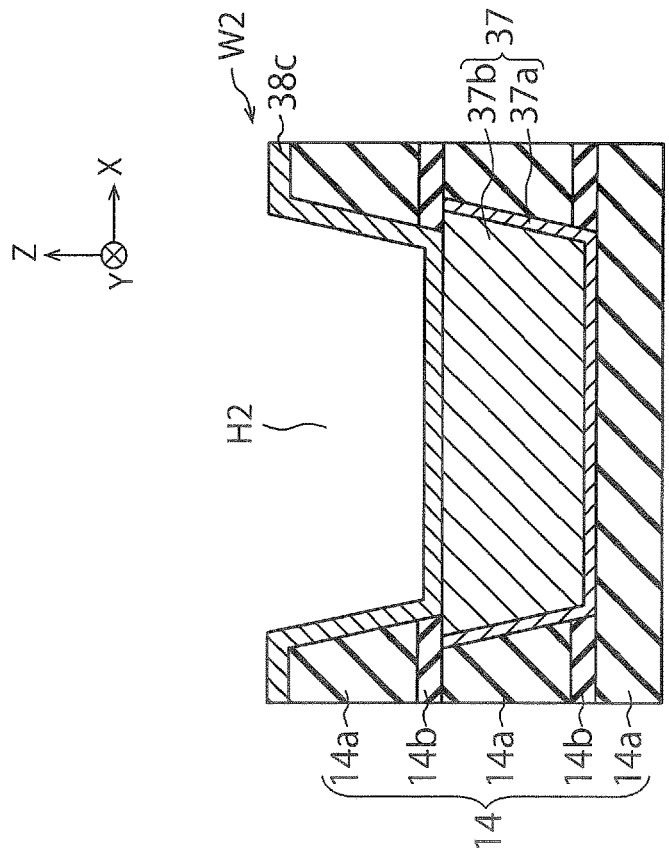

Next, on the entire surface of the substrate 15, a metal layer 38d is formed by plating (see FIG. 12B). As a result, the metal layer 38d is formed, via the metal layer 38c, on the side and bottom faces of the aperture H2. The metal layer 38d is, for example, a Cu layer. The metal layer 38d is an example of a second film.

Next, the metal layers 38c and 38d and the like are annealed (see FIG. 13A). As a result, a portion of the metal layer 38c is transformed into a metal layer 38c1 due to the influence of Si atoms and O atoms in the inter layer dielectric 14. The metal layer 38c1 is, for example, an $MnSi_XO_Y$ layer (X and Y are positive integers). On the other hand, the remaining portion of the metal layer 38c is transformed into a metal layer 38c2. The metal layer 38c2 is, for example, a Cu layer. On the other hand, Mn atoms in the metal layer 38c may diffuse to the upper face of the metal layer 38d. FIG. 13A illustrates metal layers 38d1 and 38d2 generated, by this diffusion, in the metal layer 38d. The metal layer 38d1 is, for example, a Cu layer, and the metal layer 38d2 is, for example, a CuMn layer. In this manner, the barrier metal layer 38a including the metal layer 38c1 and the pad material layer 38b including the metal layer 38c2 and the metal layer 38d1 are formed.

The metal layer 38c1 is generated by the influence of Si atoms and O atoms in the inter layer dielectric 14, and is therefore formed on the side faces of the aperture H2 but is not formed on the bottom face of the aperture H2. As a result, the metal layer 38c2 is formed on the side faces of the aperture H2 via the metal layer 38c1, and is directly formed on the interconnection 37 (the interconnection material layer 37b) on the bottom face of the aperture H2.

Next, the surfaces of the metal layers 38d2, 38d1, 38c2, and 38c1 are flattened by CMP (see FIG. 13B). As a result, the metal layers 38d2, 38d1, 38c2, and 38c1 outside the aperture H2 are removed, and the metal pad 38 including the metal layers 38c1, 38c2, and 38d1 is formed in the aperture H2. That is, the metal pad 38 including the barrier metal layer 38a and the pad material layer 38b is formed in the aperture H2.

Figure 14B:
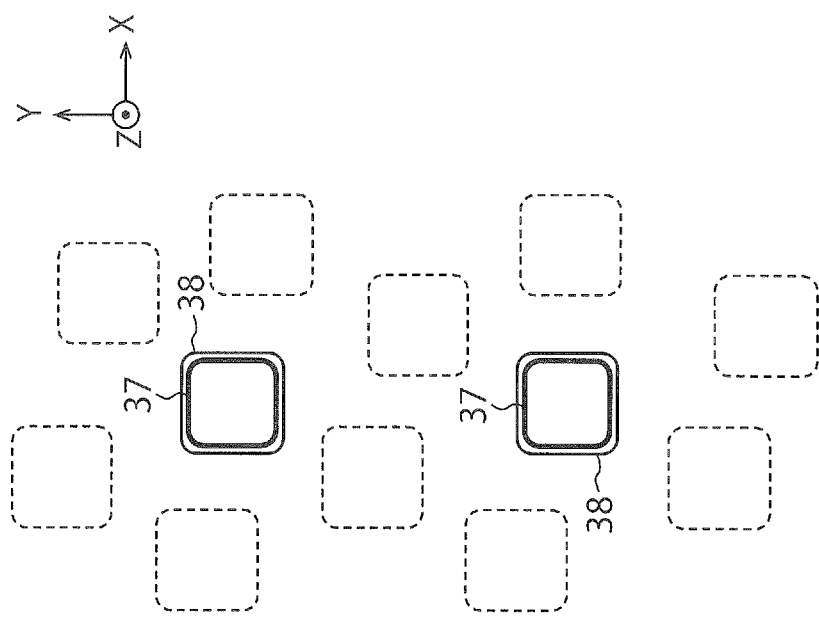
FIGS. 14A and 14B are plan views for comparing the semiconductor device of the first embodiment with the semiconductor device of the comparative example.
Figure 14A:
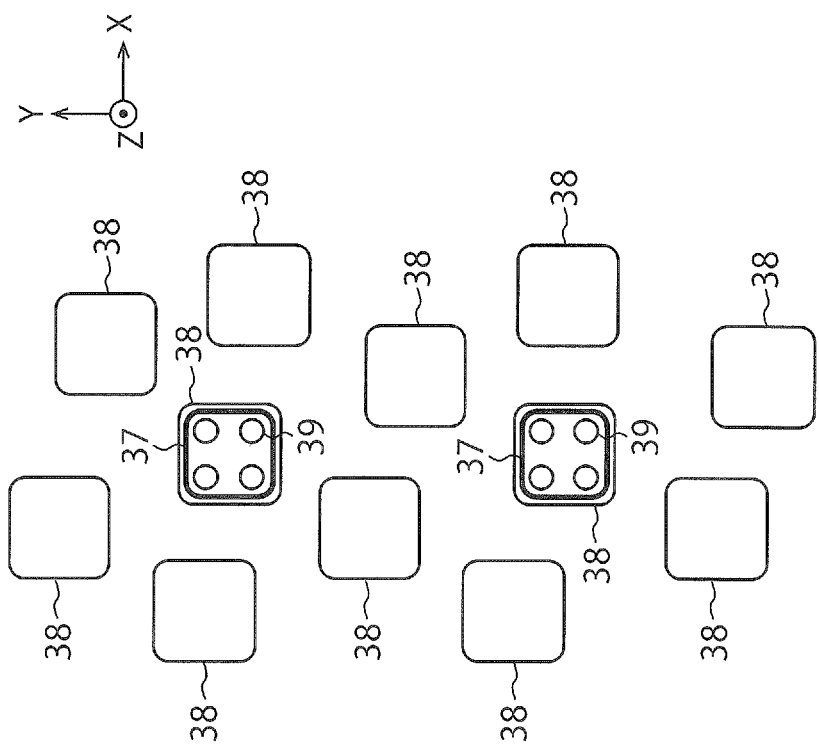

FIGS. 14A and 14B are plan views for comparing the semiconductor device of the first embodiment with the semiconductor device of the comparative example.

FIG. 14A illustrates an example of the plane structure of the semiconductor device of the comparative example illustrated in FIG. 5A. FIG. 14A illustrates the plurality of interconnections 37, the plurality of via plugs 39 disposed on these interconnections 3, and the plurality of metal pads 38 disposed on these via plugs 39.

However, FIG. 14A illustrates metal pads 38 that are not disposed on the interconnections 37 and the via plugs 39, in addition to the interconnections 37 and the metal pads 38 disposed on the via plugs 39. The latter metal pads 38 are dummy pads that are not used for electrically connecting components in the semiconductor device.

FIG. 14B illustrates an example of the plane structure of the semiconductor device of the first embodiment illustrated in FIG. 4A. FIG. 14B illustrates the plurality of interconnections 37, and the plurality of metal pads 38 disposed on these interconnections 37.

The metal pad 38 illustrated in FIG. 14B does not include the above-mentioned dummy pad. The reason is because the metal pad 38 of the present embodiment is directly formed on the interconnection 37 and therefore, if the dummy pad is disposed, the dummy pad becomes an obstacle when the interconnection 37 is disposed. However, when it is necessary to provide dummy pads, the number of the dummy pads and the arrangement thereof may be determined so as to prevent the dummy pads from becoming obstacles when disposing the interconnections 37.

The upper face of the metal pad 38 illustrated in FIG. 14B has substantially the same size as the upper face of the interconnection 37 illustrated in FIG. 14B. The size of the upper face of the metal pad 38 may be larger than the size of the upper face of the interconnection 37 or smaller than the size of the upper face of the interconnection 37.

Figure 15B:
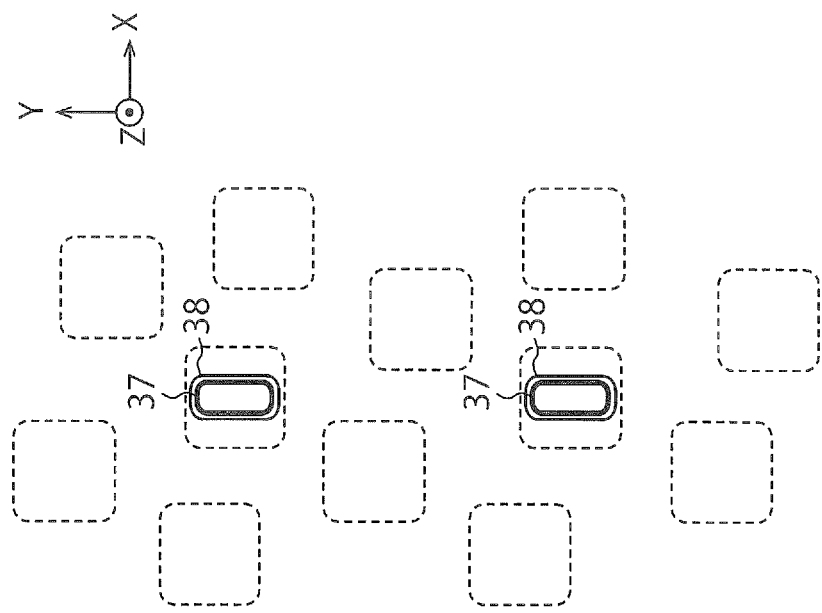
FIGS. 15A and 15B are other plan views for comparing the semiconductor device of the first embodiment with the semiconductor device of the comparative example.
Figure 15A:
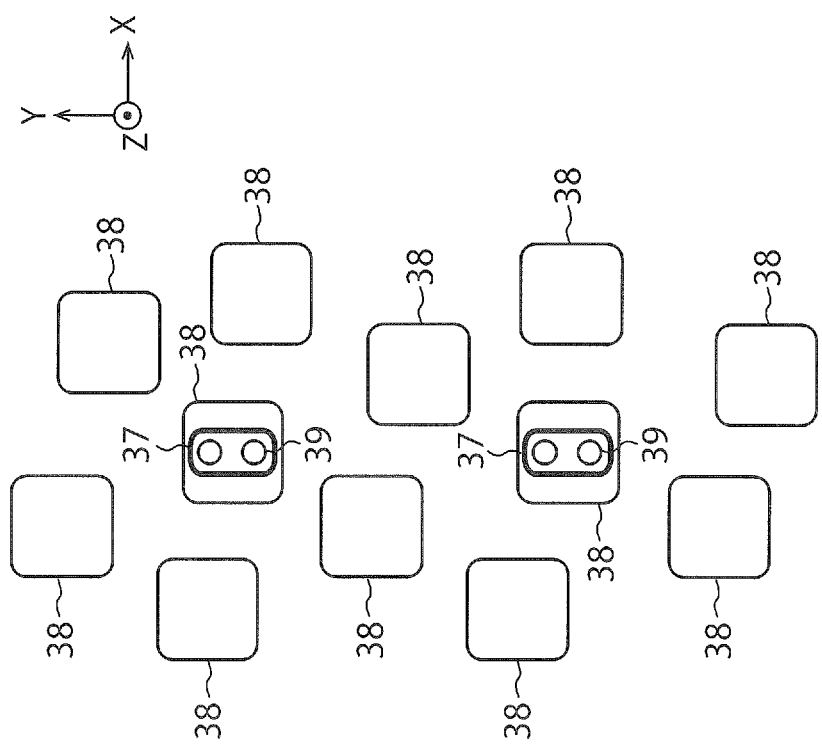

FIGS. 15A and 15B are other plan views for comparing the semiconductor device of the first embodiment with the semiconductor device of the comparative example.

FIG. 15A illustrates another example of the plane structure of the semiconductor device of the comparative example illustrated in FIG. 5A. FIG. 15A illustrates the plurality of interconnections 37, the plurality of via plugs 39 disposed on these interconnections 37, and the plurality of metal pads 38 disposed on these via plugs 39. The upper face of the interconnection 37 illustrated in FIG. 15A is approximately a half in size of the upper face of the metal pad 38 illustrated in FIG. 15A. The metal pad 38 illustrated in FIG. 15A includes dummy pads, like the metal pad 38 illustrated in FIG. 14A.

FIG. 15B illustrates another example of the plane structure of the semiconductor device of the first embodiment illustrated in FIG. 4A. FIG. 15B illustrates the plurality of interconnections 37, and the plurality of metal pads 38 disposed on these interconnections 37. Further, the metal pad 38 illustrated in FIG. 15B does not include any dummy pad, like the metal pad 38 illustrated in FIG. 14B.

The upper face of the interconnection 37 illustrated in FIG. 15B has the same size as the upper face of the interconnection 37 illustrated in FIG. 15A. That is, the upper face of the interconnection 37 illustrated in FIG. 15B is approximately a half in size of the upper face of the interconnection 37 illustrated in FIG. 14B. Therefore, in this example, the size of the upper face of the metal pad 38 illustrated in FIG. 15B is set to be approximately a half of the size of the upper face of the metal pad 38 illustrated in FIG. 14B. As mentioned above, in the present embodiment, when the size of the interconnection 37 is reduced, the size of the metal pad 38 may also be reduced. This makes it possible to reduce the failure in arranging the metal pad 38 with respect to the interconnection 37, for example.

In the second embodiment described below, the via plug is disposed between the interconnection 37 and the metal pad 38, like the above-described comparative example. Therefore, the metal pad 38 of the second embodiment may include numerous dummy pads, like the metal pad 38 of the comparative example.

The contents described with reference to FIGS. 14A to 15B are applied not only to the circuit chip 2 but also to the array chip 1. In this case, the interconnection 37, the via plug 39, and the metal pad 38 in the description are replaced by the interconnection 42, the via plug 48, and the metal pad 41, respectively.

As mentioned above, the metal pad 38 of the present embodiment includes the barrier metal layer 38a provided in the inter layer dielectric 14, and the pad material layer 38b that is provided, via the barrier metal layer 38a, in the inter layer dielectric 14 and is in contact with the interconnection 37. Similarly, the metal pad 41 of the present embodiment includes the barrier metal layer 41a provided in the inter layer dielectric 13, and the pad material layer 41b that is provided, via the barrier metal layer 41a, in the inter layer dielectric 13 and is in contact with the interconnection 42.

Therefore, according to the present embodiment, it becomes possible to form the metal pads 38 and 41 suitable for bonding. For example, it becomes possible to increase the effective metal pad thickness while setting the thicknesses of the metal pads 38 and 41 to be thin.

Second Embodiment

Figure 16B:
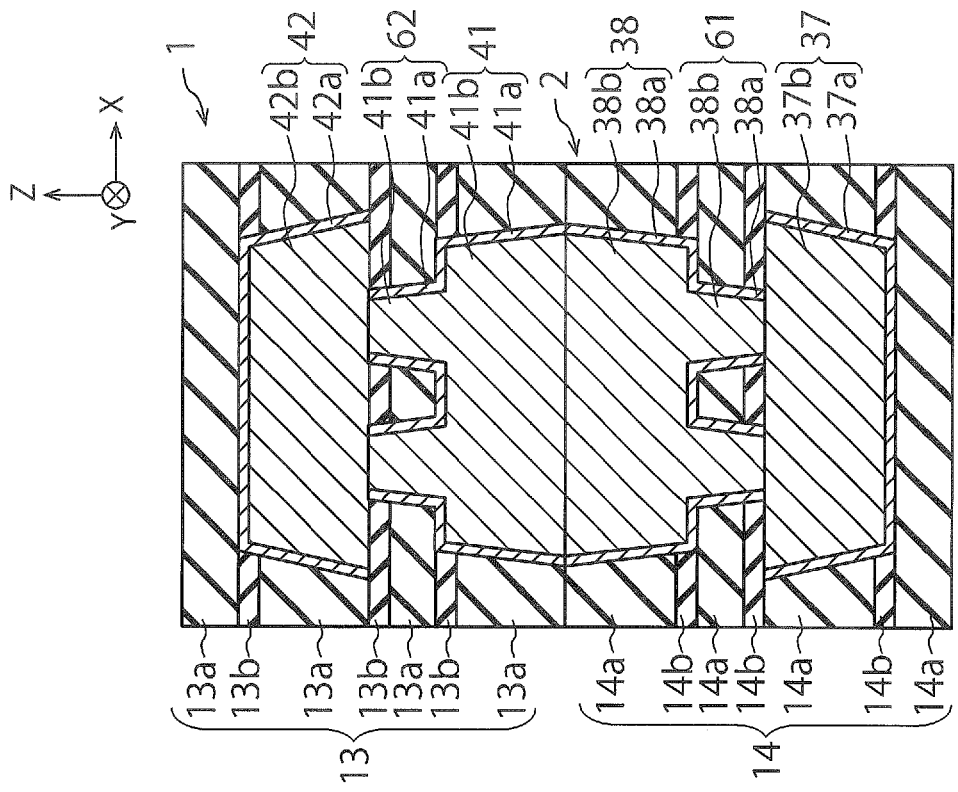
FIGS. 16A and 16B are cross-sectional views illustrating the structure of a semiconductor device of a second embodiment.
Figure 16A:
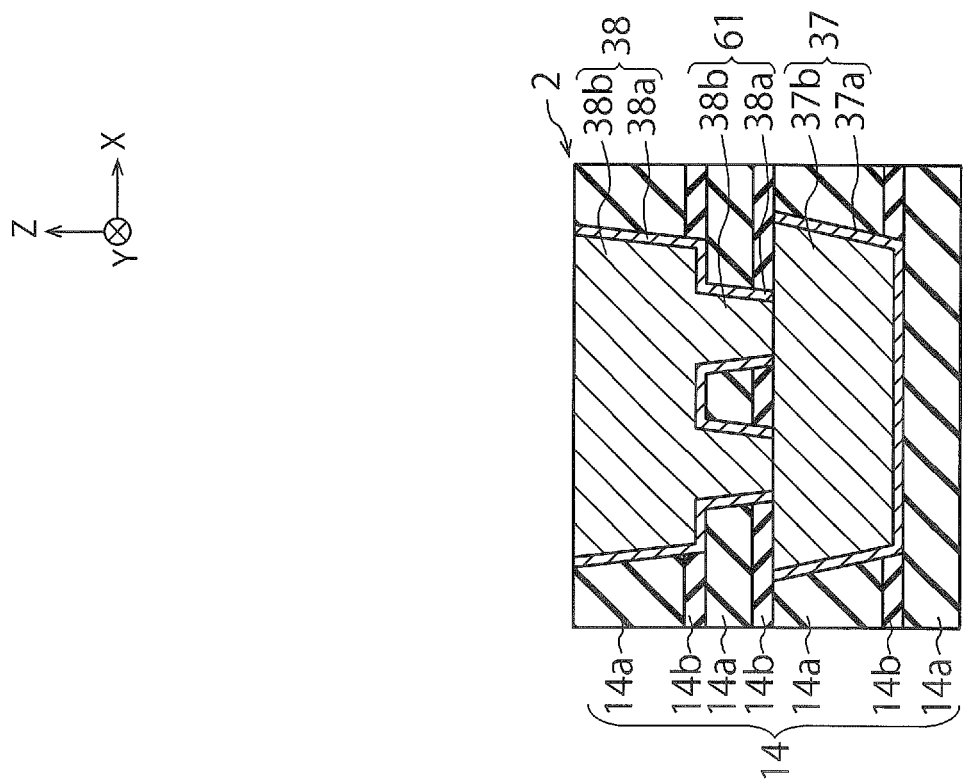

FIGS. 16A and 16B are cross-sectional views illustrating the structure of a semiconductor device of a second embodiment.

FIG. 16A illustrates the inter layer dielectric 14, the interconnection 37, and the metal pad 38, which are similar to those illustrated in FIG. 4A, and a plurality of via plugs 61. These via plugs 61 are examples of a first plug. The thicknesses of the interconnection 37, the via plug 61, and the metal pad 38 of the present embodiment are, for example, 500 µm, 200 nm, and 300 nm. Therefore, the total thickness of the interconnection 37, the via plug 61, and the metal pad 38 of the present embodiment is similar to the total thickness of the interconnection 37 and the metal pad 38 of the first embodiment and is 1 µm. Hereinafter, an arbitrary one of these via plugs 61 will be described in detail.

The via plug 61 is formed between the interconnection 37 and the metal pad 38. The via plug 61 includes the barrier metal layer 38a and the pad material layer (plug material layer) 38b that are the same as those of the metal pad 38. The via plug 61 and the metal pad 38 can be formed by the dual damascene method.

However, the pad material layer 38b of the above-described comparative example is formed on the interconnection 37 via the barrier metal layer 38a. On the other hand, the pad material layer 38b of the present embodiment is directly formed on the interconnection 37. The barrier metal layer 38a and the pad material layer 38b of the present embodiment can be formed, for example, by performing processing similar to the processes illustrated in FIGS. 10A to 11B, or the processes illustrated in FIGS. 12A to 13B, as described below. Note that the barrier metal layer 38a of the present embodiment does not cover the upper face of the interconnection 37 under the via plug 61, but covers the upper face of the inter layer dielectric 14 under the metal pad 38.

In addition to the components illustrated in FIG. 16A, FIG. 16B illustrates the inter layer dielectric 13, the metal pad 41, and the interconnection 42, which are similar to those illustrated in FIG. 4B, and a plurality of via plugs 62. These via plugs 62 are examples of a second plug. The thicknesses of the metal pad 41, the via plug 62, and the interconnection 42 of the present embodiment are, for example, 300 µm, 200 nm, and 500 nm. Therefore, the total thickness of the metal pad 41, the via plug 62, and the interconnection 42 of the present embodiment is similar to the total thickness of the metal pad 41 and the interconnection 42 of the first embodiment and is 1 µm. Hereinafter, an arbitrary one of these via plugs 62 will be described in detail.

The via plug 62 is formed between the metal pad 41 and the interconnection 42. The via plug 62 includes the barrier metal layer 41a and pad material layer (plug material layer) 42b that are the same as those of the metal pad 41. The via plug 62 and the metal pad 41 can be formed by the dual damascene method.

However, the pad material layer 41b of the above-described comparative example is formed under the interconnection 42 via the barrier metal layer 41a. On the other hand, the pad material layer 41b of the present embodiment is directly formed under the interconnection 42. The barrier metal layer 41a and the pad material layer 41b of the present embodiment can be formed, for example, by performing processing similar to the processes illustrated in FIGS. 10A to 11B, or the processes illustrated in FIGS. 12A to 13B, as described below. Note that the barrier metal layer 41a of the present embodiment does not cover the lower face of the interconnection 42 on the via plug 62, but covers the lower face of the inter layer dielectric 13 on the metal pad 41.

Hereinafter, the metal pads 38 and 41 of the present embodiment will be described in detail with reference to FIG. 16B.

In the present embodiment, the metal pad 38 and the barrier metal layer 38a of and the via plug 61 are not formed on the upper face of the interconnection 37 so that the metal pad 38 and the pad material layer (plug material layer) 38b of the via plug 61 are directly formed on the upper face of the interconnection material layer 37b of the interconnection 37. Therefore, according to the present embodiment, it becomes possible to reduce the dishing on the upper face of the metal pad 38 by the thermal expansion of the pad material layer 38b and the thermal expansion of the interconnection material layer 37b, like the first embodiment. In other words, according to the present embodiment, it becomes possible to cause the metal pad 38, the via plug 61, and the interconnection 37 to function as effective metal pad regarding the thermal expansion. The thickness of the metal pad 38 is 300 nm. On the other hand, the effective metal pad thickness is 1 µm. According to the present embodiment, the pad material layer 38b and the interconnection material layer 37b can be integrated, and this makes it possible to obtain effects similar to those of a thick metal pad even when the metal pad 38 is thin. Specifically, it becomes possible with the thin pad material layer 38b (Cu layer) to obtain the amount of thermal expansion similar to a thick pad material layer (Cu layer).

The above also holds true for the metal pad 41. In the present embodiment, the metal pad 41 and the barrier metal layer 41a of the via plug 62 are not formed on the lower face of the interconnection 42, so that the metal pad 41 and the pad material layer (plug material layer) 41b of the via plug 62 are directly formed on the lower face of the interconnection material layer 42b of the interconnection 42. Therefore, according to the present embodiment, it becomes possible to reduce the dishing on the lower face of the metal pad 41 by the thermal expansion of the pad material layer 41b and the thermal expansion of the interconnection material layer 42b.

As mentioned above, according to the present embodiment, it becomes possible to form the metal pads 38 and 41 suitable for bonding.

The dishing on the upper face of the metal pad 38 of the present embodiment is greatly reduced at a position right above the via plug 61 and is not greatly reduced at a position not directly above the via plug 61. The reason is because the expansion of the via plug 61 mainly acts to the position right above the via plug 61. Therefore, the function of reducing the dishing is generally greater in the first embodiment than in the second embodiment. On the other hand, according to the second embodiment, as mentioned above, it becomes possible to arrange numerous dummy pads, for example. The above also holds true for the metal pad 41.

Figure 17B:
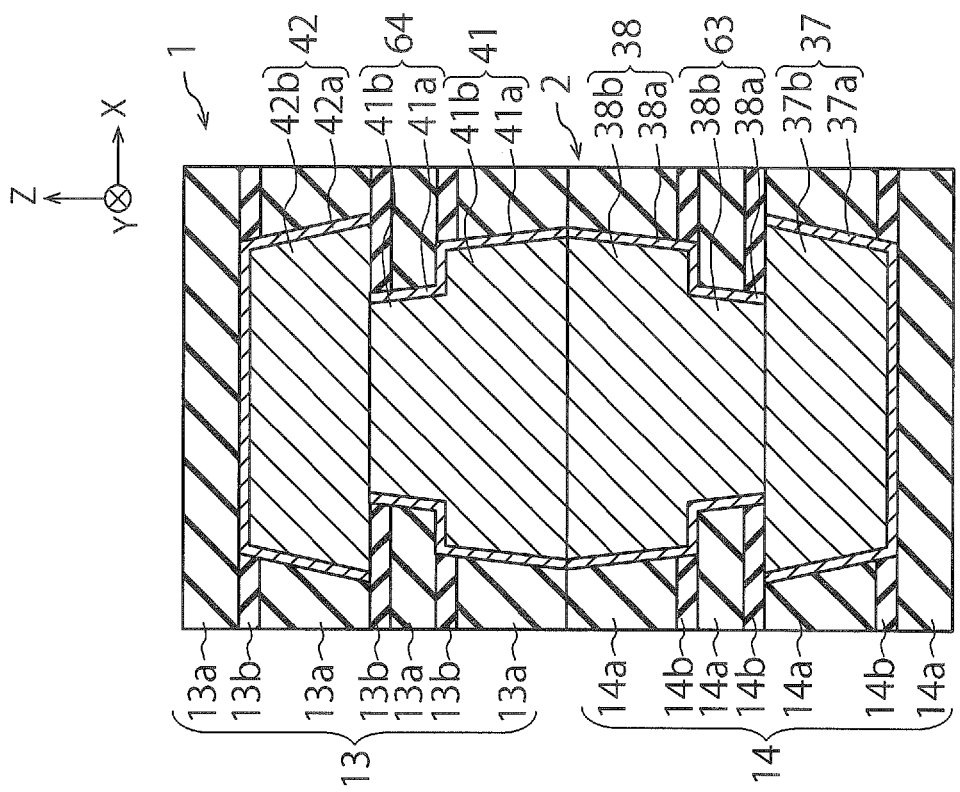
FIGS. 17A and 17B are cross-sectional views illustrating the structure of a semiconductor device of a modified example of the second embodiment.
Figure 17A:
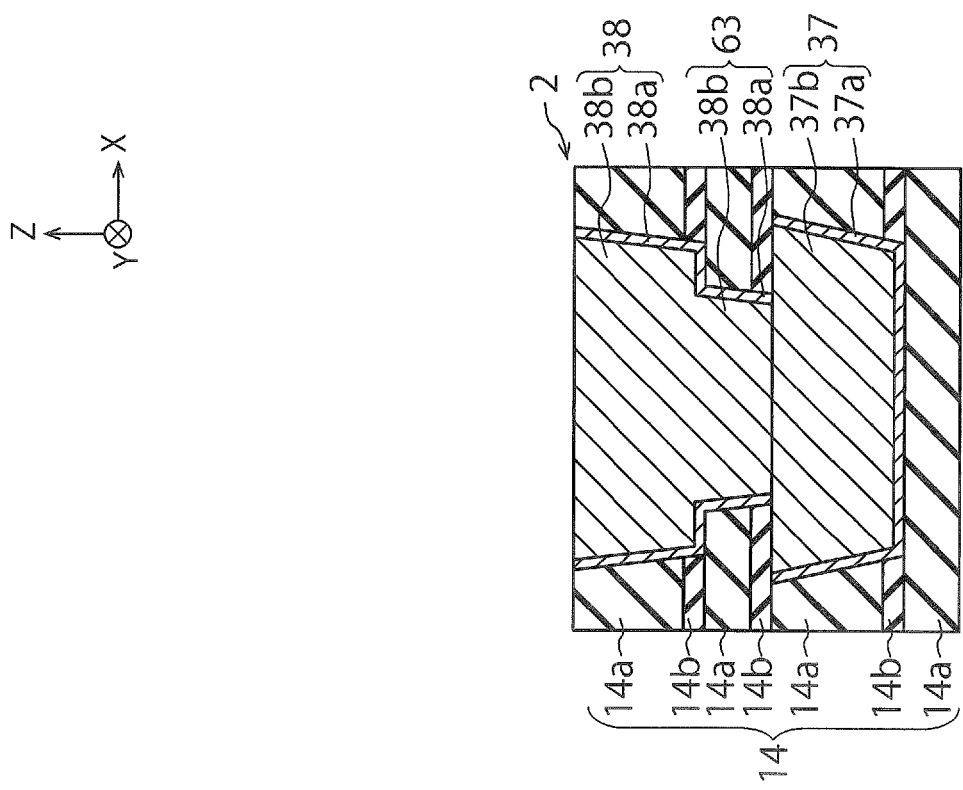
Figure 18A:
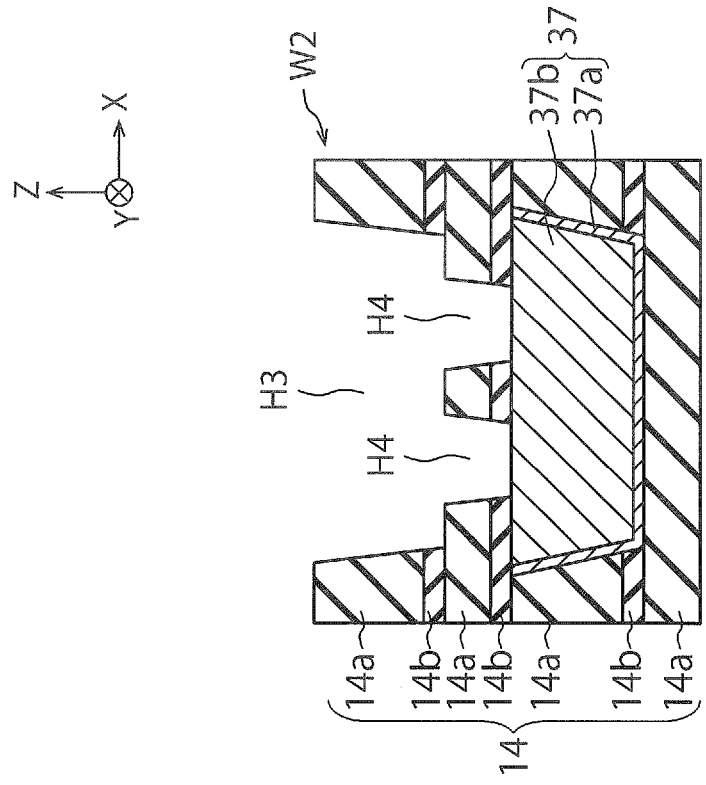
FIGS. 18A to 19B are cross-sectional views illustrating a method of manufacturing the semiconductor device of the second embodiment.
Figure 18B:
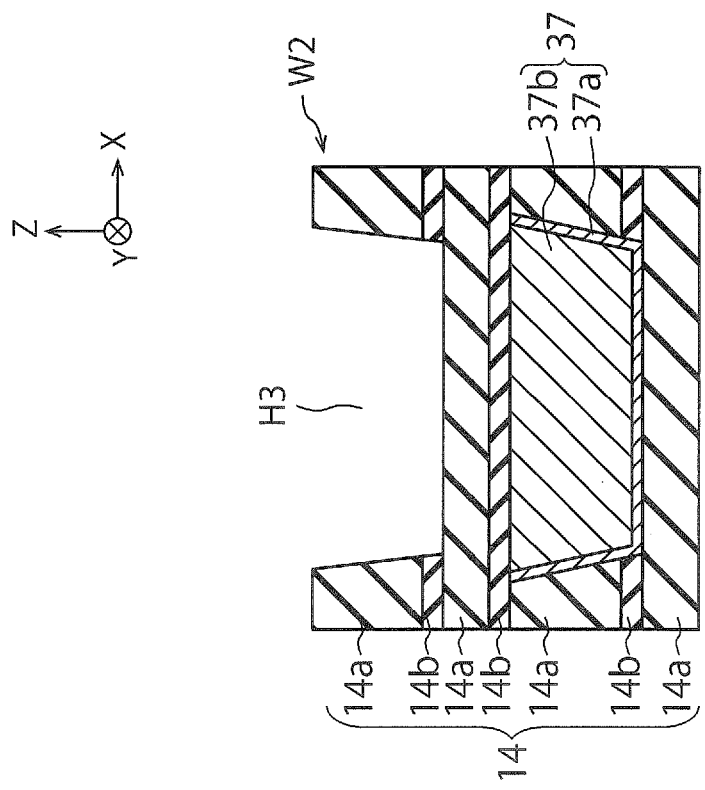

FIGS. 17A and 17B are cross-sectional views illustrating the structure of a semiconductor device of a modified example of the second embodiment.

In FIG. 17A, the plurality of small via plugs 61 illustrated in FIG. 16A are replaced by large via plugs 63. Similarly, in FIG. 17B, the plurality of small via plugs 62 illustrated in FIG. 16B are replaced by large via plugs 64. The via plugs 63 and 64 are similar to the via plugs 61 and 62 in properties, except for the size of the plane shape. The via plug 63 is an example of the first plug, and the via plug 64 is an example of the second plug.

According to this modified example, it becomes possible to form the metal pads 38 and 41 suitable for bonding, like the second embodiment. Further, according to this modified example, it becomes possible to exert the function of reducing the dishing in a wide region right above the via plug 63, compared to the second embodiment. The reason is that the size of the via plug 63 is large. In other words, according to this modified example, it becomes possible to enjoy the advantages of the first embodiment while enjoying the advantages of the second embodiment. The above holds true for the metal pad 41 similarly.

FIGS. 18A to 19B are cross-sectional views illustrating a method of manufacturing the semiconductor device of the second embodiment. Processes illustrated in these drawings are performed when manufacturing the semiconductor device illustrated in FIG. 16A or FIG. 16B, and are performed on the circuit wafer W2 in the process illustrated in FIG. 3.

First, the processes illustrated in FIGS. 6A to 7B are performed. As a result, above the substrate 15 (not illustrated), the interconnection 37 including the barrier metal layer 37a and the interconnection material layer 37b is formed (see FIG. 18A). Next, above the substrate 15, the insulator 14b, the insulator 14a, the insulator 14b, and the insulator 14a are sequentially formed (see FIG. 18A). Next, an aperture H3 is formed by RIE in the latter insulator 14a and the latter insulator 14b (see FIG. 18A). Next, in the former insulator 14a and the former insulator 14b, a plurality of via holes H4 is formed by RIE (see FIG. 18B). As a result, the upper face of the interconnection 37 is exposed in these via holes H4 under the aperture H3.

Figure 19A:
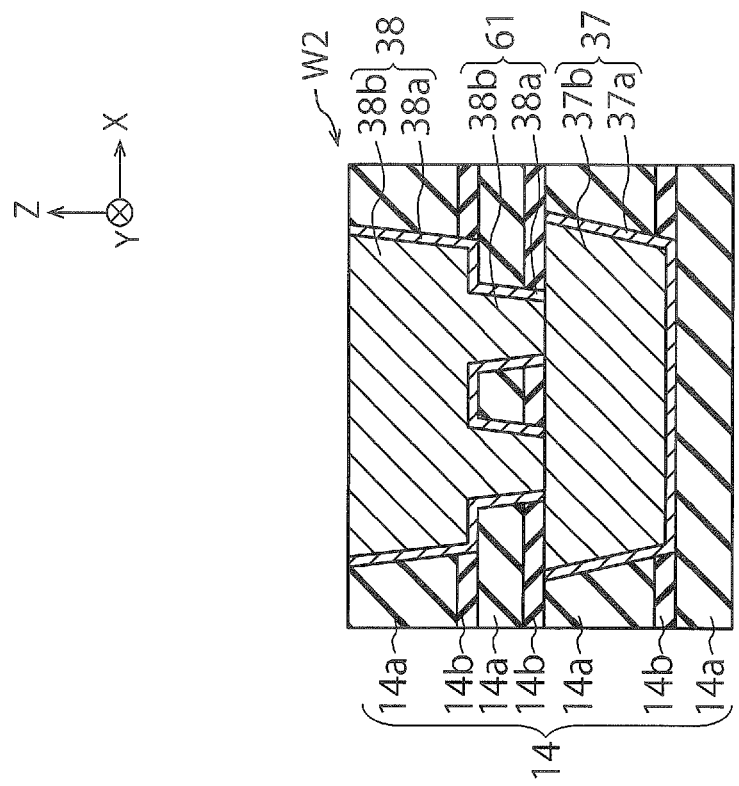
Figure 19B:
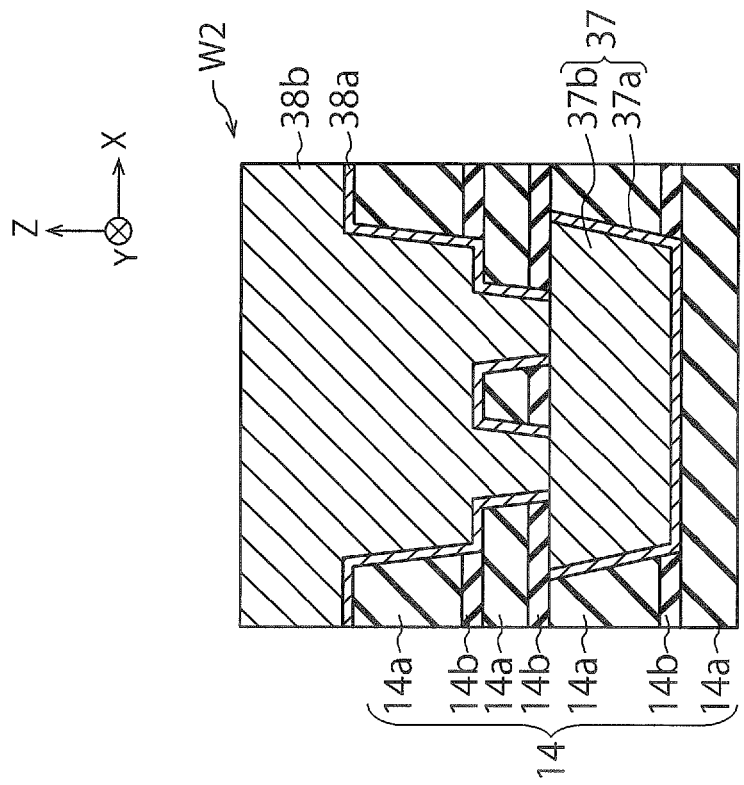

Next, on the entire surface of the substrate 15, the barrier metal layer 38a and the pad material layer 38b are sequentially formed (see FIG. 19A). As a result, the barrier metal layer 38a is formed on side and bottom faces of the aperture H3 and side faces of the via hole H4. Further, the pad material layer 38b is formed, via the barrier metal layer 38a, on the side and bottom faces of the aperture H3 and the side faces of the via hole H4, and is directly formed on the interconnection 37 (the interconnection material layer 37b) on the bottom face of the via hole H4. An example of a method of forming the barrier metal layer 38a and the pad material layer 38b will be described below. Next, the surfaces of the pad material layer 38b and the barrier metal layer 38a are flattened by CMP (see FIG. 19B). As a result, the barrier metal layer 38a and the pad material layer 38b outside the aperture H3 and via hole H4 are removed. The metal pad 38 including the barrier metal layer 38a and the pad material layer 38b is formed in the aperture H3. The via plug 61 including the barrier metal layer 38a and the pad material layer 38b is formed in the via hole H4.

The processes illustrated in these drawings are similarly performed for the array wafer W1 in the process illustrated in FIG. 3. Specifically, the processes in these drawings are performed by replacing the substrate 15, the inter layer dielectric 14, the interconnection 37, the via plug 61, and the metal pad 38 with the substrate 16, the inter layer dielectric 13, the interconnection 42, the via plug 62, and the metal pad 41, respectively. Subsequently, the array wafer W1 and the circuit wafer W2 are bonded together in the process illustrated in FIG. 3 to manufacture the semiconductor device of the present embodiment.

The above method is applicable when manufacturing the semiconductor device illustrated in FIG. 17A or FIG. 17B. In this case, the processes relating to the via plugs 61 and 62 are replaced by the processes relating to the via plugs 63 and 64. For example, the plurality of small via holes H4 is replaced by a large via hole.

FIGS. 20A to 21B are cross-sectional views illustrating a first example of the method of manufacturing the semiconductor device of the second embodiment. The processes illustrated in these drawings illustrate an example of the process illustrated in FIG. 19A.

Figure 20A:
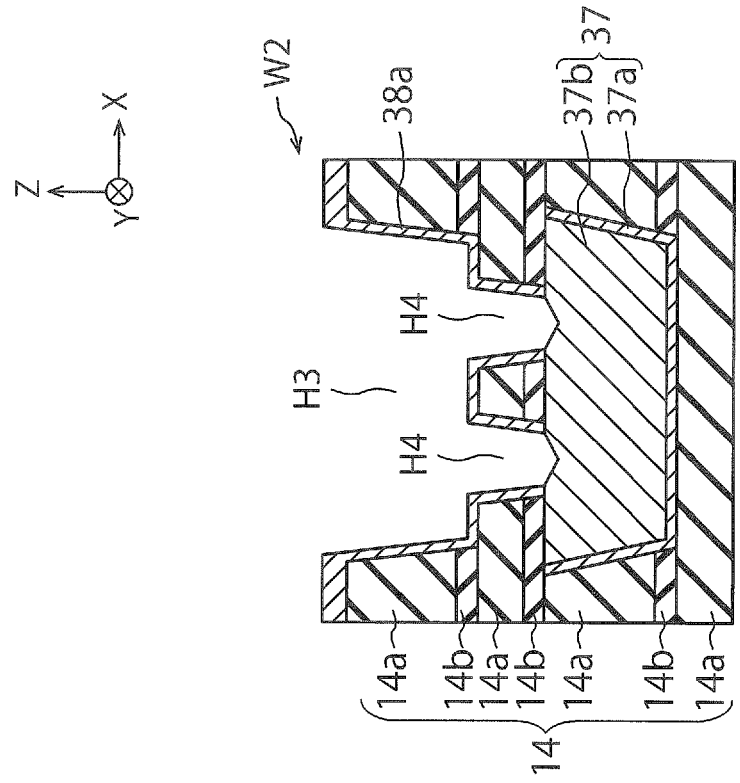
FIGS. 20A to 21B are cross-sectional views illustrating a first example of the method of manufacturing the semiconductor device of the second embodiment.

First, the barrier metal layer 38a is deposited on the entire surface of the substrate 15 (see FIG. 20A). As a result, the barrier metal layer 38a is formed on the upper face of the interconnection 37 in the via hole H4, the side and upper faces of the inter layer dielectric 14 in the via hole H4 and the apertures H3, and the upper face of the inter layer dielectric 14 outside the via hole H4 and the apertures H3.

At this time, due to the characteristics of the process for depositing the barrier metal layer 38a, the barrier metal layer 38a on the interconnection 37 in the via hole H4 becomes thinner than the barrier metal layer 38a on the upper face of the inter layer dielectric 14 in the aperture H3. The barrier metal layer 38a on the upper face of the inter layer dielectric 14 in the aperture H3 becomes thinner than the barrier metal layer 38a on the inter layer dielectric 14 outside the via hole H4 and the aperture H3.

Figure 20B:
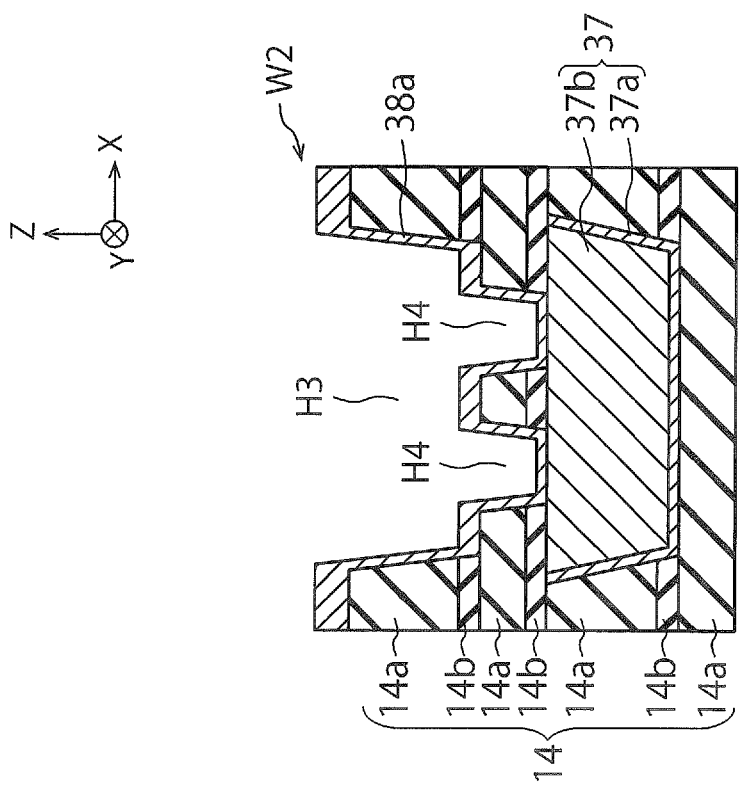

Next, the barrier metal layer 38a is thinned by re-sputtering using argon (see FIG. 20B). This makes it possible to remove the barrier metal layer 38a on the interconnection 37 in the via hole H4. As a result, the upper face of the interconnection 37 is exposed again in the via hole H4. The barrier metal layer 38a on the upper face of the inter layer dielectric 14 in the aperture H3 and the barrier metal layer 38a on the inter layer dielectric 14 outside the via hole H4 and the aperture H3 are thicker than the barrier metal layer 38a on the interconnection 37 in the via hole H4, and is therefore not completely removed during the above thinning. Further, due to the characteristics of the re-sputtering, the barrier metal layer 38a also remains on the side faces of the inter layer dielectric 14 in the via hole H4 and the aperture H3.

In the process illustrated in FIG. 20B, there is a possibility that a part of the interconnection material layer 37b is also removed and a recess is formed on the upper face of the interconnection material layer 37b. FIG. 20B illustrates an example of such a recess. When the barrier metal layer 38a on the bottom face of the via hole H4 is removed, atoms generated by the removal of the barrier metal layer 38a may adhere to the barrier metal layer 38a on the side faces of the via hole H4. In this case, the thickness of the barrier metal layer 38a on the side faces of the via hole H4 increases due to the adhesion of such atoms. The same applies to the barrier metal layer 38a in the aperture H3.

Figure 21B:
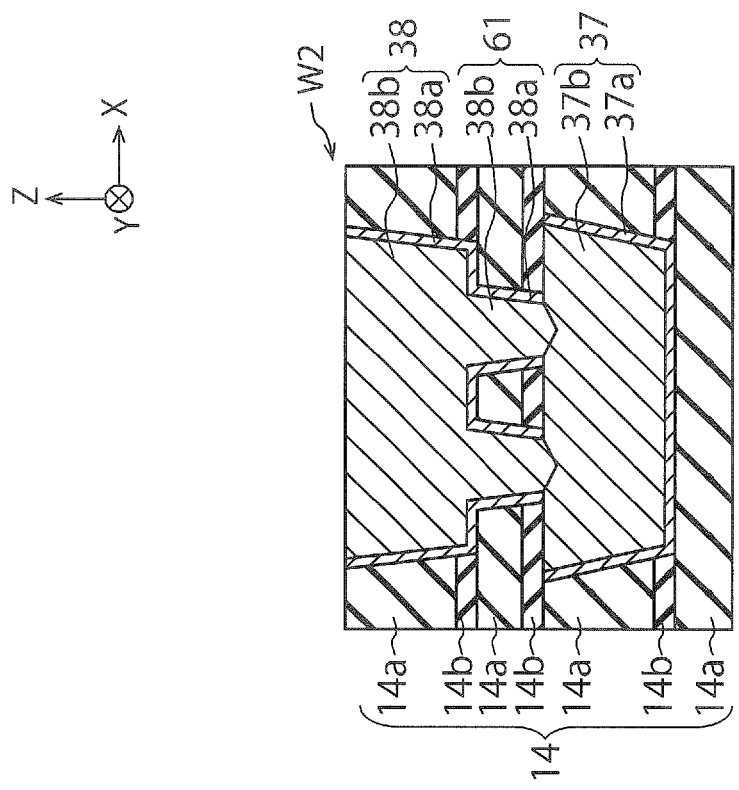
Figure 21A:
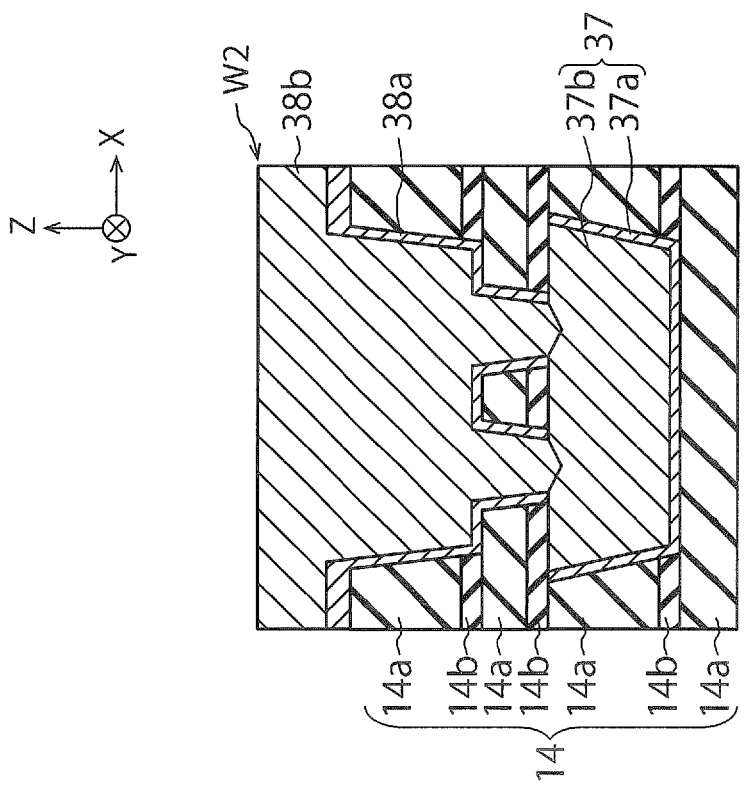

Next, the pad material layer 38b is formed on the entire surface of the substrate 15 (see FIG. 21A). As a result, the pad material layer 38b is formed, via the barrier metal layer 38a, on the side and bottom faces of the aperture H3 and the side faces of the via hole H4, and is directly formed on the interconnection 37 (the interconnection material layer 37b) on the bottom face of the via hole H4.

Next, the surfaces of the pad material layer 38b and the barrier metal layer 38a are flattened by CMP (see FIG. 21B). As a result, the barrier metal layer 38a and the pad material layer 38b outside the via hole H4 and the aperture H3 are removed. The metal pad 38 including the barrier metal layer 38a and the pad material layer 38b is formed in the aperture H3. The via plug 61 including the barrier metal layer 38a and the pad material layer 38b is formed in the via hole H4.

FIGS. 22A to 23B are cross-sectional views illustrating a second example of the method of manufacturing the semiconductor device of the second embodiment. The processes illustrated in these drawings illustrate another example of the process illustrated in FIG. 19A.

Figure 22A:
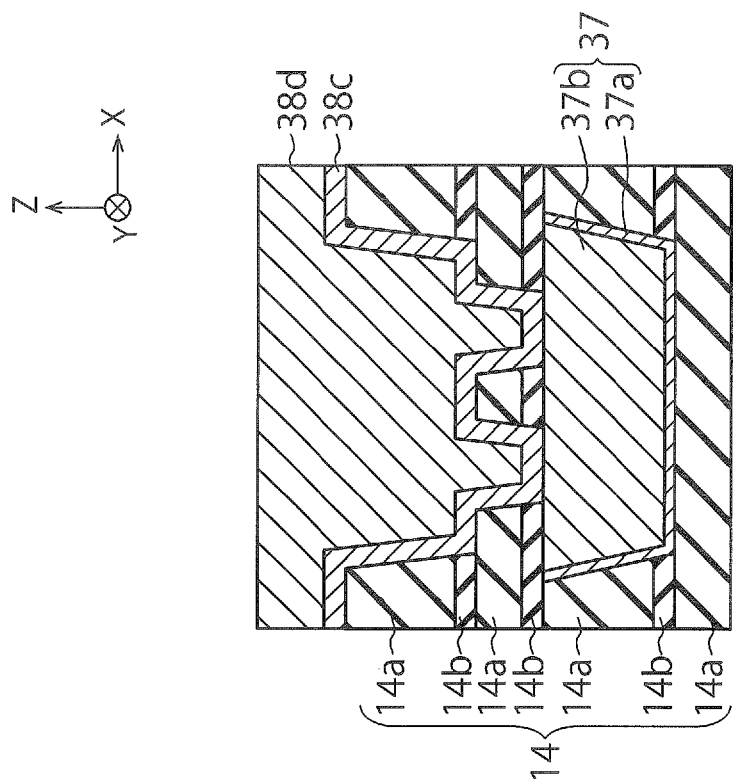
FIGS. 22A to 23B are cross-sectional views illustrating a second example of the method of manufacturing the semiconductor device of the second embodiment.

First, the metal layer 38c is deposited by sputtering on the entire surface of the substrate 15 (see FIG. 22A). As a result, the metal layer 38c is formed on the upper face of the interconnection 37 in the via hole H4, the side and upper faces of the inter layer dielectric 14 in the via hole H4 and the aperture H3, and the upper face of the inter layer dielectric 14 outside the via hole H4 and the aperture H3. The metal layer 38c is, for example, a CuMn seed layer. The metal layer 38c is an example of the first film.

Figure 22B:
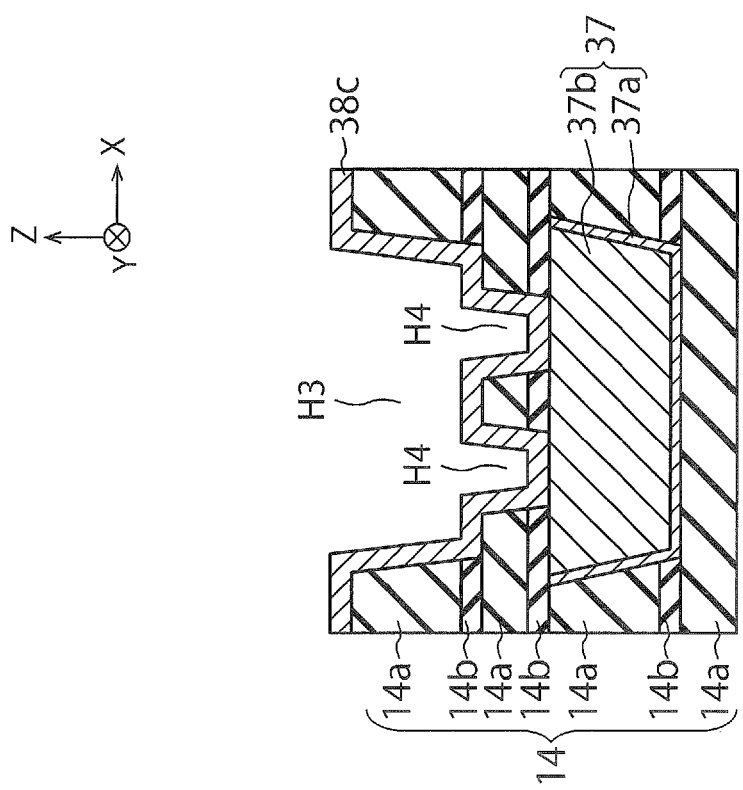

Next, on the entire surface of the substrate 15, the metal layer 38d is formed by plating (see FIG. 22B). As a result, the metal layer 38d is formed, via the metal layer 38c, on the side and bottom faces of the via hole H4 and the aperture H3. The metal layer 38d is, for example, a Cu layer. The metal layer 38d is an example of the second film.

Figure 23A:
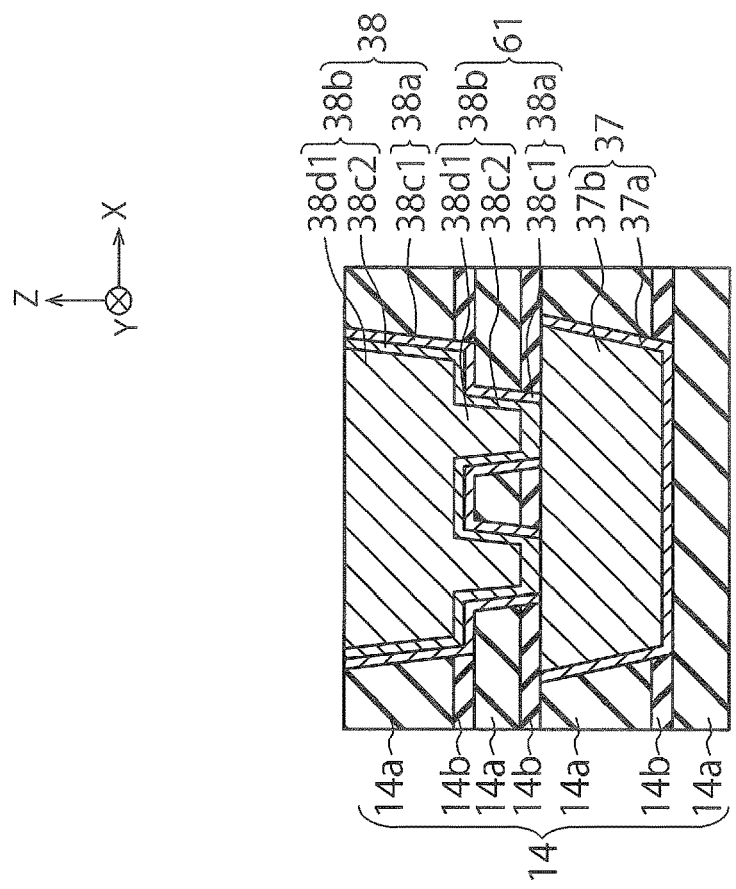

Next, the metal layers 38c and 38d and the like are annealed (see FIG. 23A). As a result, a portion of the metal layer 38c is transformed into the metal layer 38c1 due to the influence of Si atoms and O atoms in the inter layer dielectric 14. The metal layer 38c1 is, for example, an $MnSi_XO_Y$ layer. On the other hand, the remaining portion of the metal layer 38c is transformed into the metal layer 38c2. The metal layer 38c2 is, for example, a Cu layer. On the other hand, Mn atoms in the metal layer 38c may diffuse to the upper face of the metal layer 38d. FIG. 23A illustrates the metal layers 38d1 and 38d2 generated, by this diffusion, in the metal layer 38d. The metal layer 38d1 is, for example, a Cu layer, and the metal layer 38d2 is, for example, a CuMn layer. In this manner, the barrier metal layer 38a including the metal layer 38c1 and the pad material layer 38b including the metal layer 38c2 and the metal layer 38d1 are formed.

The metal layer 38c1 is generated by the influence of Si atoms and O atoms in the inter layer dielectric 14, and is therefore formed on the side and bottom faces of the aperture H3 and the side faces of the via hole H4, but is not formed on the bottom face of the via hole H4. As a result, the metal layer 38c2 is formed, via the metal layer 38c1, on the side and bottom faces of the aperture H3 and the side faces of the via hole H4, and is directly formed on the interconnection 37 (the interconnection material layer 37b) on the bottom face of the via hole H4.

Figure 23B:
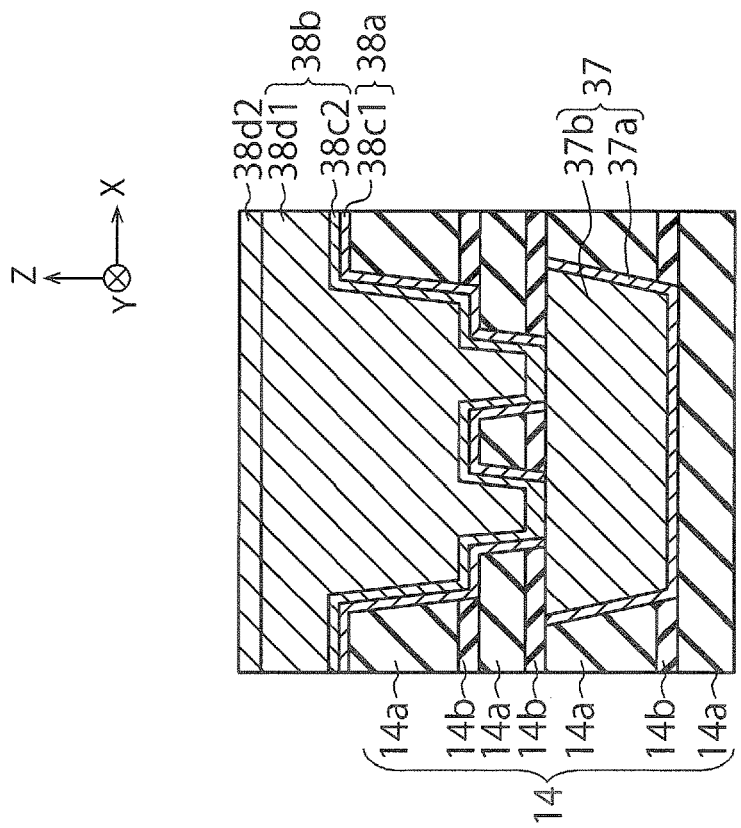

Next, the surfaces of the metal layers 38d2, 38d1, 38c2, and 38c1 are flattened by CMP (see FIG. 23B). As a result, the metal layers 38d2, 38d1, 38c2, and 38c1 outside the via hole H4 and the aperture H3 are removed. The metal pad 38 including the metal layers 38c1, 38c2, and 38d1 is formed in the aperture H3. The via plug 61 including the metal layers 38c1, 38c2, and 38d1 is formed in the via hole H4. That is, the metal pad 38 including the barrier metal layer 38a and the pad material layer 38b is formed in the aperture H3. The via plug 61 including the barrier metal layer 38a and the pad material layer 38b is formed in the via hole H4.

As mentioned above, the metal pad 38 and the via plug 61 (or 63) of the present embodiment include the barrier metal layer 38a provided in the inter layer dielectric 14 and the pad material layer 38b that is provided, via the barrier metal layer 38a, in the inter layer dielectric 14 and is in contact with the interconnection 37. Similarly, the metal pad 41 and the via plug 62 (or 64) of the present embodiment includes the barrier metal layer 41a provided in the inter layer dielectric 13 and the pad material layer 41b that is provided, via the barrier metal layer 41a, in the inter layer dielectric 13 and is in contact with the interconnection 42.

Therefore, according to the present embodiment, it becomes possible to form the metal pads 38 and 41 suitable for bonding, like the first embodiment. For example, it becomes possible to increase the effective metal pad thickness while setting the thickness of the metal pads 38 and 41 to be thin.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a first interconnection provided above the substrate;
   a first pad provided on the first interconnection;
   a second pad provided on the first pad; and
   a second interconnection provided on the second pad,
   wherein
   the first pad includes a first layer provided in a first insulator above the substrate, and a second layer that is provided in the first insulator via the first layer and is directly in contact with the first interconnection, or
   the second pad includes a third layer provided in a second insulator above the substrate, and a fourth layer that is provided in the second insulator via the third layer and is directly in contact with the second interconnection.

2. The device of claim 1, wherein
   the first pad includes the first layer, and the second layer that is directly in contact with the first interconnection, and
   the second pad includes the third layer, and the fourth layer that is directly in contact with the second interconnection.

3. The device of claim 2, wherein the fourth layer is directly in contact with the second layer.

4. The device of claim 1, further comprising a first plug provided between the first interconnection and the first pad,
   wherein the first plug and the first pad include the first layer, and the second layer that is directly in contact with the first interconnection.

5. The device of claim 1, further comprising a second plug provided between the second pad and the second interconnection,
   wherein the second pad and the second plug include the third layer, and the fourth layer that is directly in contact with the second interconnection.

6. The device of claim 1, wherein the first interconnection includes a fifth layer provided in the first insulator, and a sixth layer that is provided in the first insulator via the fifth layer and is directly in contact with the second layer.

7. The device of claim 6, wherein the second layer and the sixth layer include a same metal element.

8. The device of claim 1, wherein the second interconnection includes a seventh layer provided in the second insulator, and an eighth layer that is provided in the second insulator via the seventh layer and is directly in contact with the fourth layer.

9. The device of claim 8, wherein the fourth layer and the eighth layer include a same metal element.

10. The device of claim 1, further comprising:
    a memory cell array provided above the substrate, and electrically connected to the second pad via the second interconnection; and
    a control circuit provided on the substrate, electrically connected to the first pad via the first interconnection, and configured to control the memory cell array.

11. A method of manufacturing a semiconductor device, comprising:
    forming a first interconnection above a first substrate;
    forming a first pad on the first interconnection;
    forming a second interconnection above a second substrate;
    forming a second pad on the second interconnection; and disposing the second pad on the first pad by bonding the first pad formed on the first substrate with the second pad formed on the second substrate, wherein the first pad is formed so as to include a first layer provided in a first insulator above the first substrate, and a second layer that is provided in the first insulator via the first layer and is directly in contact with the first interconnection, or the second pad is formed so as to include a third layer provided in a second insulator above the second substrate, and a fourth layer that is provided in the second insulator via the third layer and is directly in contact with the second interconnection.

12. The method of claim 11, wherein
the first pad is formed so as to include the first layer, and the second layer that is directly in contact with the first interconnection, and
the second pad is formed so as to include the third layer, and the fourth layer that is directly in contact with the second interconnection.

13. The method of claim 11, wherein
the first pad is formed on the first interconnection via a first plug, and
the first plug and the first pad are formed so as to include the first layer, and the second layer that is directly in contact with the first interconnection.

14. The method of claim 11, wherein
the second pad is formed on the second interconnection via a second plug, and
the second plug and the second pad are formed so as to include the third layer, and the fourth layer that is directly in contact with the second interconnection.

15. The method of claim 11, wherein
the first interconnection is formed so as to include a fifth layer provided in the first insulator, and a sixth layer that is provided in the first insulator via the fifth layer and is directly in contact with the second layer.

16. The method of claim 15, wherein the second layer and the sixth layer are formed so as to include a same metal element.

17. The method of claim 11, wherein the second interconnection is formed so as to include a seventh layer provided in the second insulator, and an eighth layer that is provided in the second insulator via the seventh layer and is directly in contact with the fourth layer.

18. The method of claim 17, wherein the fourth layer and the eighth layer are formed so as to include a same metal element.

19. The method of claim 11, wherein the first pad is formed by forming the first layer on a side face of the first insulator and an upper face of the first interconnection, removing the first layer from the upper face of the first interconnection while leaving the first layer on the side face of the first insulator, and forming the second layer on a side face of the first layer and the upper face of the first interconnection, or the second pad is formed by forming the third layer on a side face of the second insulator and an upper face of the second interconnection, removing the third layer from the upper face of the second interconnection while leaving the third layer on the side face of the second insulator, and forming the fourth layer on a side face of the third layer and the upper face of the second interconnection.

20. The method of claim 11, wherein the first pad is formed by sequentially forming a first film and a second film on a side face of the first insulator and an upper face of the first interconnection, forming the first layer by transforming a portion of the first film, and forming the second layer by a remaining portion of the first film and the second film, or the second pad is formed by sequentially forming a third film and a fourth film on a side face of the second insulator and an upper face of the second interconnection, forming the third layer by transforming a portion of the third film, and forming the fourth layer by a remaining portion of the third film and the fourth film.

* * * * *